(12) United States Patent
Huang et al.

(10) Patent No.: US 11,715,519 B2
(45) Date of Patent: Aug. 1, 2023

(54) BIT LINE AND WORD LINE CONNECTION FOR MEMORY ARRAY

(71) Applicant: Taiwan Semiconductor Manufacturing Company, Ltd., Hsin-Chu (TW)

(72) Inventors: Chang-Chih Huang, Taichung (TW); Jui-Yu Pan, Neipu Township (TW); Kuo-Chyuan Tzeng, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 24 days.

(21) Appl. No.: 17/555,932

(22) Filed: Dec. 20, 2021

(65) Prior Publication Data

US 2022/0115066 A1   Apr. 14, 2022

Related U.S. Application Data

(62) Division of application No. 16/821,208, filed on Mar. 17, 2020, now Pat. No. 11,211,120.

(51) Int. Cl.
| | | |
|---|---|---|
| *G11C 13/00* | (2006.01) | |
| *H10B 63/00* | (2023.01) | |
| *G11C 11/56* | (2006.01) | |
| *H10N 70/00* | (2023.01) | |

(52) U.S. Cl.
CPC .......... *G11C 13/0028* (2013.01); *G11C 11/56* (2013.01); *G11C 13/0026* (2013.01); *H10B 63/20* (2023.02); *H10B 63/80* (2023.02); *H10B 63/84* (2023.02); *H10N 70/063* (2023.02); *H10N 70/8265* (2023.02)

(58) Field of Classification Search
CPC . G11C 11/56; G11C 13/0026; G11C 13/0028; H10B 63/20; H10B 63/80; H10B 63/84; H10N 70/063; H10N 70/8265
See application file for complete search history.

(56) References Cited

U.S. PATENT DOCUMENTS

| | | | |
|---|---|---|---|
| 7,858,468 B2 | 12/2010 | Liu et al. | |
| 9,997,530 B2 | 6/2018 | Yon et al. | |
| 10,038,006 B2 | 7/2018 | Furihata et al. | |
| 10,622,555 B2 * | 4/2020 | Trinh | H10N 70/8413 |

(Continued)

OTHER PUBLICATIONS

Wikipedia.org "Antenna Effect." Published Nov. 17, 2019.

(Continued)

*Primary Examiner* — Son L Mai
(74) *Attorney, Agent, or Firm* — Eschweiler & Potashnik, LLC

(57) ABSTRACT

Various embodiments of the present application are directed towards a method for forming an integrated chip. The method includes forming a dielectric structure over a substrate. A first conductive wire is formed along the dielectric structure. The first conductive wire extends laterally along a first direction. A memory stack is formed on a top surface of the first conductive wire. A second conductive wire is formed over the memory stack. The second conductive wire extends laterally along a second direction orthogonal to the first direction. An upper conductive via is formed on the top surface of the first conductive wire. An upper surface of the upper conductive via is above the second conductive wire.

20 Claims, 11 Drawing Sheets

(56) References Cited

U.S. PATENT DOCUMENTS

| | | | |
|---|---|---|---|
| 10,644,069 B2 | 5/2020 | Jeong et al. | |
| 10,707,417 B1 | 7/2020 | Bruce et al. | |
| 10,748,927 B1* | 8/2020 | Tsutsumi | H10B 41/41 |
| 10,790,300 B2 | 9/2020 | Rajashekhar et al. | |
| 10,861,871 B2 | 12/2020 | Tobioka | |
| 11,088,201 B2* | 8/2021 | Lin | H10B 61/22 |
| 2009/0230378 A1 | 9/2009 | Ryoo et al. | |
| 2010/0108970 A1 | 5/2010 | Liu et al. | |
| 2013/0221309 A1 | 8/2013 | Lee | |
| 2013/0313510 A1 | 11/2013 | Liu et al. | |
| 2014/0284535 A1 | 9/2014 | Saitoh et al. | |
| 2015/0102280 A1 | 4/2015 | Lee | |
| 2015/0280123 A1 | 10/2015 | Redaelli et al. | |
| 2015/0303239 A1 | 10/2015 | Liu et al. | |
| 2015/0318331 A1 | 11/2015 | Pellizzer et al. | |
| 2015/0372005 A1 | 12/2015 | Yon et al. | |
| 2017/0179026 A1 | 6/2017 | Toyama et al. | |
| 2019/0140022 A1 | 5/2019 | Jeong et al. | |
| 2020/0044148 A1 | 2/2020 | Trinh et al. | |

OTHER PUBLICATIONS

Wikipedia.org "Galvanic Corrosion." Published on Mar. 9, 2020.
Non-Final Office Action dated Apr. 22, 2021 for U.S. Appl. No. 16/821,208.
Notice of Allowance dated Aug. 20, 2021 for U.S. Appl. No. 16/821,208.

* cited by examiner

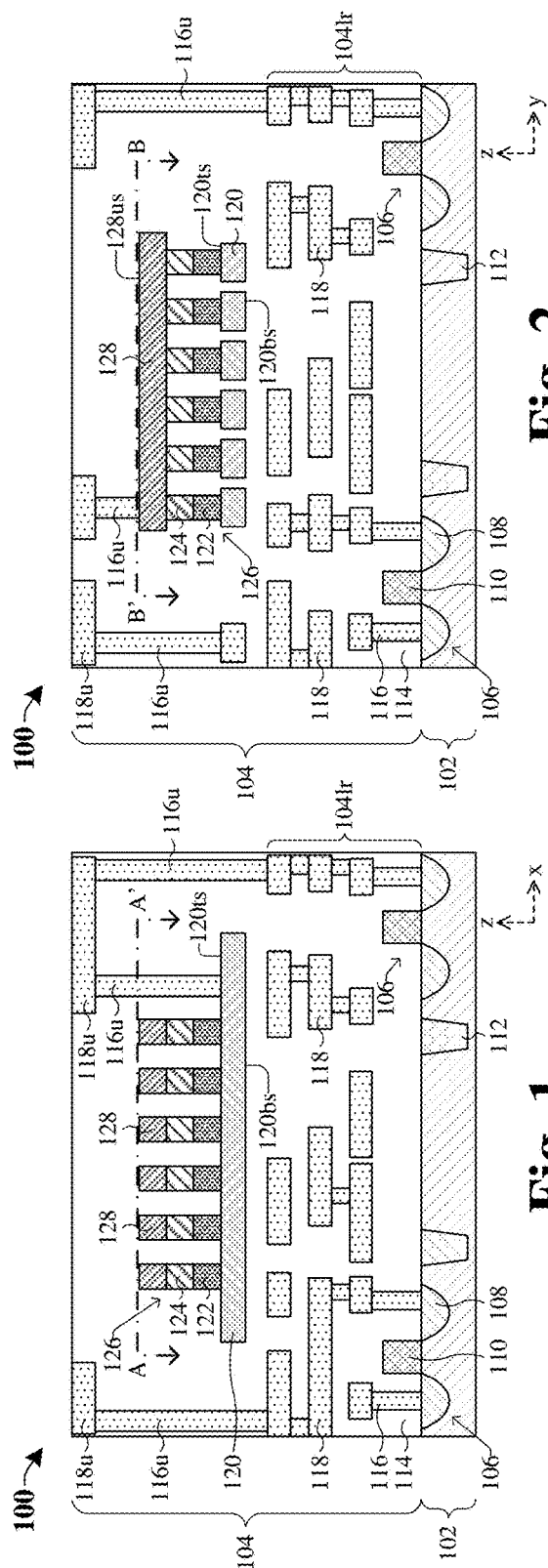
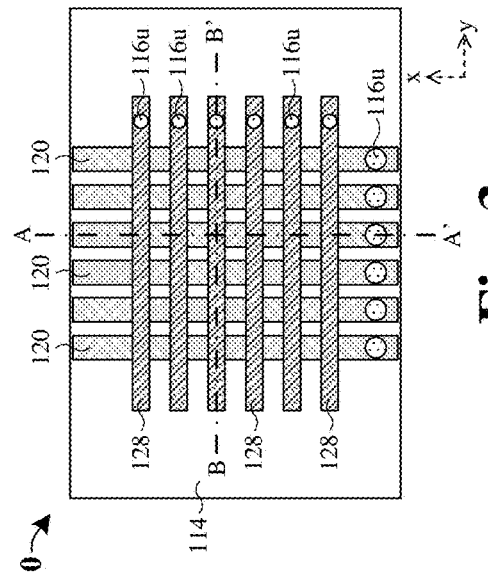

BIT LINE AND WORD LINE CONNECTION FOR MEMORY ARRAY

REFERENCE TO RELATED APPLICATION

This application is a Divisional of U.S. application Ser. No. 16/821,208, filed on Mar. 17, 2020, the contents of which are hereby incorporated by reference in their entirety.

BACKGROUND

Many modern-day electronic devices include electronic memory. A cross-point memory architecture with one selector-one memory cell (1S1MC) stacks is increasingly receiving attention for use with next generation electronic memory due to its high density. Examples of next generation electronic memory include resistive random-access memory (RRAM), phase-change random-access memory (PCRAM), and magnetoresistive random-access memory (MRAM).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-3 illustrate various views of some embodiments of a memory device having a plurality of memory cells disposed between overlying bit lines and underlying word lines in an interconnect structure, where an upper conductive via extends from above the memory cells to a top surface of a corresponding word line.

DETAILED DESCRIPTION

Figure 4A:
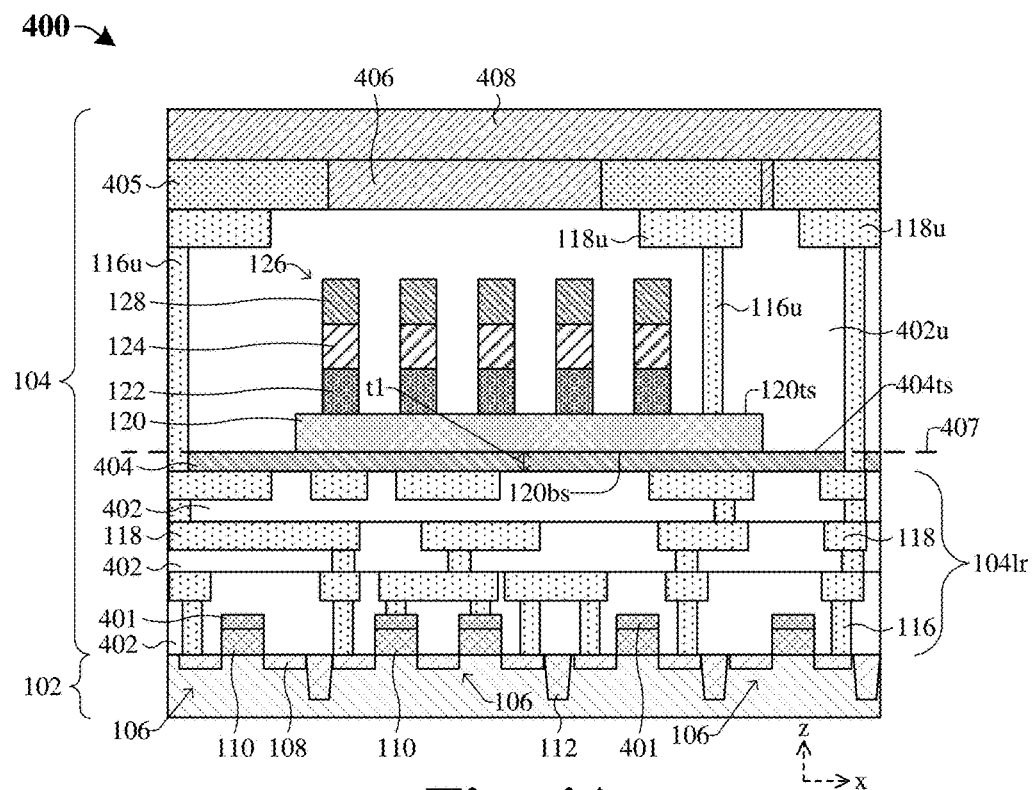
FIGS. 4A-C illustrate various views of some alternative embodiments of the memory device of FIGS. 1-3.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A cross-point memory array may include a plurality of memory cells disposed within an interconnect structure that overlies a substrate. The memory cells define a memory array and are arranged in a plurality of rows and a plurality of columns (e.g., in a crossbar array). A plurality of word lines is disposed beneath the memory array, and a plurality of bit lines is disposed over the memory array. The word lines each extend along an individual row in the memory array and are each coupled to the memory cells in the individual row. The bit lines each extend along an individual column in the memory array and are each coupled to the memory cells in the individual column. The plurality of bit lines and the plurality of word lines are electrically coupled to semiconductor devices (e.g., transistors) disposed within/over the substrate by way of conductive vias and conductive wires disposed within the interconnect structure. Thus, bias voltages may be applied to the plurality of bit lines and the plurality of word lines by way of the conductive vias and wires in the interconnect structure to select an individual memory cell (e.g., to read/write/erase the cell).

One challenge with the cross-point memory array is a connection between the word lines and corresponding lower conductive vias within the interconnect structure. For example, the interconnect structure includes lower conductive vias and lower conductive wires directly electrically coupled to a transistor disposed within and/or on the substrate. During fabrication, a first word line may be formed over a lower conductive via that is directly electrically coupled to the transistor, such that there is an electrical path between the first word line and the transistor. A process for forming the first word line may include reactive-ion etching of the conductive material of the first word line. A plasma used in the reactive-ion etching may add charge carriers (e.g., electrons) to the first word line. Because the first word line is relatively long, the first word line may act as an antenna and hence a large amount of charge carriers may build up in the first word line. The large amount of charge carriers can travel across the lower conductive via to the transistor, thereby causing breakdown in a gate dielectric layer of the transistor.

Further, the first word line may comprise a first material (e.g., tungsten) different than a second material (e.g., aluminum, copper, an alloy of the foregoing, etc.) of the lower conductive via. During fabrication, the first word line and the lower conductive via are exposed to one or more processing fluids (e.g., etch residue cleaning fluids, deionized water, etc.). When the lower conductive via is exposed to the one or more processing fluids, galvanic corrosion of the lower conductive via may occur (e.g., due a reaction between the one or more processing fluids and the second material). This may result in formation of an oxide at the interface between the lower conductive via and the first word line, thereby causing delamination between the lower conductive via and the first word line and/or causing delamination of layers disposed over the first word line (e.g., layers making up the memory cells). Accordingly, performance of the cross-point memory array may be negatively affected (e.g., reduced yield, memory cell breakdown, transistor breakdown, etc.)

Various embodiments of the present disclosure are directed toward an integrated chip having a cross-point memory array with a plurality of memory cells disposed between a plurality of word lines and a plurality of bit lines. In various embodiments, the bit lines overlie the memory cells and the word lines underlie the memory cells. The memory array is disposed within an interconnect structure including conductive features that are disposed within a dielectric structure and that are electrically coupled to the bit lines and the word lines. The conductive features include lower conductive vias and lower conductive wires underlying the word lines, and upper conductive vias and upper conductive wires overlying the bit lines. The lower conductive vias and wires are offset from a bottom surface of each word line by a non-zero distance, such that the dielectric structure continuously extends along the bottom surface of each word line and such that the bottom surface of each word line is completely spaced from the lower conductive vias and wires. Further, an upper conductive via extends from an upper conductive wire, which is disposed above the bit lines, to contact with a top surface of each word line. This forms an electrical connection between each word line and a corresponding semiconductor device (e.g., transistor) disposed within and/or on the substrate.

During fabrication of the integrated chip, the upper conductive vias are formed after the word lines, such that the electrical paths between the word lines and the corresponding semiconductor device are formed after fabrication of the word lines. Charge carriers (e.g., electrons) accumulated in the word lines (e.g., due to a reactive-ion etch) may be dispersed before forming the upper conductive vias over the top surface of each word line. For example, before forming the upper conductive vias, a charge carrier removal process may be performed on the word lines to remove the accumulated charge carriers. This may reduce breakdown of the semiconductor devices. Further, because the lower conductive vias and wires are offset the bottom surface of each word line, galvanic corrosion between the word lines and the lower conductive vias may not occur. Accordingly, this reduces delamination of the word lines and/or memory cells, thereby increasing a performance (e.g., yield) of the cross-point memory array.

FIGS. 1-3 illustrate various views of some embodiments of a memory device 100 having a plurality of one selector-one memory cell (1S1MC) stacks 126 disposed between a plurality of word lines 120 and a plurality of bit lines 128. FIG. 3 illustrates a top view of some embodiments of the memory device 100. FIG. 1 illustrates a cross-sectional view of some embodiments of the memory device 100 taken along line A-A' of FIG. 3. FIG. 2 illustrates a cross-sectional view of some alternative embodiments of the memory device 100 taken along line B-B' of FIG. 3.

The memory device 100 includes an interconnect structure 104 overlying a substrate 102. Semiconductor devices 106 are disposed within and/or over the substrate 102. In some embodiments, the semiconductor devices 106 may be configured as transistors. In such embodiments, the semiconductor devices 106 may include a gate structure 110 and source/drain regions 108 disposed within the substrate 102 on opposing sides of the gate structure 110. In some embodiments, the gate structure 110 includes a gate electrode overlying a gate dielectric layer. Isolation structures 112 are disposed within the substrate 102 between adjacent semiconductor devices 106. The interconnect structure 104 includes an interconnect dielectric structure 114, a plurality of conductive vias 116, and a plurality of conductive wires 118. The conductive vias 116 and the conductive wires 118 are disposed within the interconnect dielectric structure 114 and are configured to electrically couple devices disposed within the memory device 100 to one another.

The plurality of word lines 120 and the plurality of bit lines 128 are disposed within the interconnect dielectric structure 114 between upper and lower layers of the conductive vias and wires 116, 118. In some embodiments, the word lines 120 may be referred to as first conductive lines, and the bit lines 128 may be referred to as second conductive lines. The plurality of word lines 120 each extend laterally in a first direction (e.g., along the x-axis). In various embodiments, the word lines 120 are arranged in parallel with one another. Further, the plurality of bit lines 128 each extend laterally in a second direction (e.g., along the y-axis) transverse the first direction. In some embodiments, the bit lines 128 are arranged in parallel with one another. In further embodiments, the first direction is orthogonal to the second direction. In some embodiments, the word lines 120 and the bit lines 128 may, for example, respectively be or comprise copper, aluminum, tungsten, titanium nitride, tantalum nitride, another suitable conductive material, or any combination of the foregoing. In further embodiments, the word lines 120 and the bit lines 128 may, for example, respectively comprise a single material, such as tungsten.

The plurality of 1S1MC stacks 126 are disposed between the plurality of word lines 120 and the plurality of bit lines 128. In various embodiments, the 1S1MC stacks 126 are arranged in an array having a plurality of rows and a plurality of columns. In some embodiments, an individual word line 120 and an individual bit line 128 are coupled to each individual 1S1MC stack 126. In further embodiments, respective word lines 120 are coupled to respective rows of 1S1MC stacks 126. In yet further embodiments, respective bit lines 128 are coupled to respective columns of 1S1MC stacks 126.

Each 1S1MC stack 126 includes a memory cell 124 overlying a threshold selector 122. The memory cell 124 is configured to store data and may be a non-volatile memory cell or a volatile memory cell. In some embodiments, the memory cell 124 may be a resistive switching memory cell (e.g., resistive random-access memory (RRAM) cell, phase-change random-access memory (PCRAM) cell, metal-cation RRAM, etc.) configured to store data based on a resistive state of a data storage structure. For example, the data storage structure may have a high resistance state associated with a first data state (e.g., binary "0") or a low resistance state associated with a second data state (e.g., binary "1"). In some embodiments, the data storage structure may comprise, for example, a chalcogenide, an oxide, a nitride, a high-k dielectric, some other suitable dielectric, or any combination of the foregoing. In further embodiments, the memory cell 124 may be magnetoresistive random-access memory (MRAM) cell. In such an embodiment, the data storage structure may comprise a magnetic tunnel junction (MTJ) configured to store data based on a magnetic orientation of the MTJ. In addition, the threshold selector 122 is configured to switch between a low resistance state and a high resistance state depending on a voltage applied across the threshold selector 122. For example, the threshold selector 122 may be in a high resistance state if a voltage applied across the threshold selector 122 is less than the threshold voltage, and the threshold selector 122 may have a low resistance state if a voltage across the threshold selector 122 is greater than the threshold voltage.

In some embodiments, the interconnect dielectric structure 114 continuously extends between opposing outer sidewalls of each word line 120 along a bottom surface 120bs of each word line 120. Thus, conductive vias 116 and conductive wires 118 disposed in a lower region 104lr of the interconnect structure 104 are offset from the bottom surface 120bs of each word line 120. In some embodiments, the bottom surface 120bs does not directly contact any of the conductive vias 116 and/or is completely spaced from the conductive vias 116. In some embodiments, the bottom surface 120bs directly contacts the interconnect dielectric structure 114 throughout an entirety of the bottom surface 120bs. Further, upper conductive wires 118u and upper conductive vias 116u overlie the plurality of bit lines 128 and word lines 120. Upper conductive vias 116u continuously extend from upper conductive wires 118u to top surfaces 120ts of respective word lines 120. Therefore, the word lines 120 may be electrically coupled to respective semiconductor devices 106 by way of the upper conductive vias 116u.

In some embodiments, during fabrication of the memory device 100, a process for forming the word lines 120 may include: depositing a conductive material (e.g., tungsten) over the lower region 104lr of the interconnect structure 104; and subsequently performing a dry etch on the conductive material to define the word lines 120. The dry etch may include exposing the conductive material to a plasma, such that charge carriers (e.g., electrons) accumulate in the word lines 120. Because the upper conductive vias 116u are formed after forming the word lines 120, charge carriers accumulated in the word lines 120 may be dispersed before forming the electrical paths between the word lines 120 and respective semiconductor devices 106. This may reduce the likelihood of breakdown of the gate dielectric layers in the semiconductor devices 106. In addition, in some embodiments, the conductive vias and wires 116, 118 within the lower region 104lr of the interconnect structure 104 are offset and/or completely spaced from the bottom surface 120bs of each word line 120. This prevents galvanic corrosion between the word lines 120 and the conductive vias and wires 116, 118 within the lower region 104lr of the interconnect structure 104. Accordingly, delamination of the word lines 120, the 1S1MC stacks 126, and/or the bit lines 128 is reduced, thereby increasing a performance of the memory device 100.

As illustrated in the top view of FIG. 3, the word lines 120 extend continuously along the first direction (e.g., the x-axis) and are parallel to one another. Further, the bit lines 128 extend along the second direction (e.g., the y-axis) and are parallel to one another. In some embodiments, the first direction is orthogonal to the second direction. In addition, one or more upper conductive vias 116u directly overlie(s) corresponding word lines 120 and corresponding bit lines 128.

FIG. 4A illustrates a cross-sectional view of some embodiments of an integrated chip 400 including a plurality of one selector-one memory cell (1S1MC) stacks 126 disposed between a plurality of word lines 120 and a plurality of bit lines 128. In some embodiments, the cross-sectional view of FIG. 4A may be taken along the x-z plane. In further embodiments, FIG. 4A illustrates a cross-sectional view of some alternative of the memory device 100 taken along line A-A' of FIG. 3.

The integrated chip 400 includes an interconnect structure 104 overlying a substrate 102. In some embodiments, the substrate 102 may, for example, be or comprise monocrystalline silicon/CMOS bulk, silicon-germanium (SiGe), silicon on insulator (SOI), or another suitable substrate material and/or may comprise a first doping type (e.g., p-type). The interconnect structure 104 includes a plurality of conductive vias 116, a plurality of conductive wires 118, and an interconnect dielectric structure. In some embodiments, the interconnect dielectric structure includes a plurality of inter-level dielectric (ILD) layers 402, an etch stop layer 404, and passivation layers 406, 408. In some embodiments, the plurality of conductive vias and wires 116, 118 may, for example, respectively be or comprise aluminum, copper, titanium nitride, tantalum nitride, another suitable conductive material, or any combination of the foregoing. In further embodiments, the plurality of ILD layers 402 may, for example, respectively be or comprise an oxide, such as silicon dioxide, a low-k dielectric material, another suitable dielectric material, or any combination of the foregoing. In yet further embodiments, the etch stop layer 404 may, for example, be or comprise silicon dioxide, a low-k dielectric material, silicon nitride, silicon carbide, extreme low k (ELK) dielectric material, another suitable dielectric material, or any combination of the foregoing. In various embodiments, the passivation layers 406, 408 may, for example, respectively be or comprise silicon dioxide, silicon oxynitride, silicon oxycarbide, silicon nitride, silicon carbide, another suitable dielectric material, or any combination of the foregoing.

A plurality of semiconductor devices 106 are disposed within and/or over the substrate 102. In some embodiments, the semiconductor devices 106 may, for example, be configured as transistors or as another suitable semiconductor device. In such embodiments, the semiconductor devices 106 may include corresponding source/drain regions 108, corresponding gate structures 110, and corresponding gate capping layers 401. In some embodiments, the source/drain regions 108 are disposed within the substrate 102 and may comprise a second doping type (e.g., n-type) opposite the first doping type (e.g., p-type). In further embodiments, the gate structures 110 may include corresponding gate electrodes overlying corresponding gate dielectric layer. In various embodiments, the gate electrodes may, for example, be or comprise a metal (such as aluminum, tungsten, titanium, any combination of the foregoing, or the like), polysilicon, another suitable conductive material, or any combination of the foregoing. In further embodiments, the gate dielectric layers may, for example, be or comprise silicon dioxide, a high-k dielectric material, another suitable dielectric material, or any combination of the foregoing. The gate capping layers 401 are conductive and may, for example, be or comprise tantalum, titanium, a silicide, another suitable material, or any combination of the foregoing. Further, isolation structures 112 are disposed within the substrate 102 and may laterally surround a corresponding semiconductor device 106. In some embodiments, the isolation structures 112 may, for example, be configured as shallow trench isolation (STI) structures, deep trench isolation (DTI) structures, or another suitable isolation structure. In further embodiments, the isolation structures 112 may, for example, be or comprise silicon dioxide, silicon nitride, silicon carbide, another suitable dielectric material, or any combination of the foregoing.

The plurality of word lines 120 and the plurality of bit lines 128 are disposed within an upper ILD layer 402u overlying a lower region 104lr of the interconnect structure 104. In some embodiments, the etch stop layer 404 continuously extends along a top surface of a topmost ILD layer 402 in the lower region 104lr. A top surface 404ts of the etch stop layer 404 continuously and laterally extends along a bottom surface 120bs of each word line 120. In some embodiments, the top surface 404ts of the etch stop layer 404 continuously extends along the bottom surface 120bs of each word line 120 along an unbroken path and/or directly contacts an entirety of the bottom surface 120bs of each word line 120. In yet further embodiments, the etch stop layer 404 is configured to separate (e.g., completely separate) the word lines 120 from conductive vias 116 and conductive wires 118 disposed within the lower region 104lr of the interconnect structure 104. In various embodiments, the conductive vias 116 and the conductive wires 118 disposed within the lower region 104lr of the interconnect structure 104 are offset from the bottom surface 120bs of each word line 120 by a non-zero distance.

In further embodiments, the etch stop layer 404 may, for example, be or comprise an oxide, such as silicon dioxide, a low-k dielectric material, another dielectric material, or any combination of the foregoing and/or may have a thickness t1 within a range of about 100 to 1,000 Angstroms or less than about 1,000 Angstroms. It will be appreciated that other values for the thickness t1 are within the scope of the disclosure. In some embodiments, the top surface 404ts of the etch stop layer 404 is substantially flat (e.g., a flat top surface within a tolerance of a chemical mechanical planarization (CMP) process). For example, in some embodiments, at any point a height of the top surface 404ts of the etch stop layer 404 varies within a range of about −5% to +5% of the thickness t1 from a level horizontal line 407 located between the top surface 404ts of the etch stop layer 404 and the bottom surface 120bs of the word line 120. For example, if the thickness t1 is about 1,000 Angstroms, then the height of the top surface 404ts of the etch stop layer 404 varies within a range of about −50 Angstroms to +50 Angstroms from the level horizontal line 407. In other embodiments, at any point the height of the top surface 404ts of the etch stop layer 404 varies within a range of about −5 Angstroms to +5 Angstroms from the level horizontal line 407.

In some embodiments, during fabrication, the word line 120 is deposited along the top surface 404ts of the etch stop layer 404. Thus, the bottom surface 120bs of the word line 120 may be substantially flat due to the top surface 404ts of the etch stop layer 404 being substantially flat. In some embodiments, the word line 120 comprises a single material, such as tungsten. The single material may have a relatively high hardness, such that the substantially flat top surface 404ts of the etch stop layer 404 prevents stress in the word line 120. This, in part, mitigates delamination of the word line 120 and structures overlying the word line 120 (e.g., the bit lines 128 and/or the 1S1MC stacks 126).

The plurality of 1S1MC stacks 126 are disposed between the plurality of word lines 120 and the plurality of bit lines 128, such that the 1S1MC stacks 126 overlie top surfaces 120ts of corresponding word lines 120. In various embodiments, the 1S1MC stacks 126 are arranged in an array having a plurality of rows and a plurality of columns. In some embodiments, an individual word line 120 and an individual bit line 128 are coupled to each individual 1S1MC stack 126. In further embodiments, respective word lines 120 are coupled to respective rows of 1S1MC stacks 126. In yet further embodiments, respective bit lines 128 are coupled to respective columns of 1S1MC stacks 126. Each 1S1MC stack 126 includes a memory cell 124 overlying a threshold selector 122. The memory cell 124 is configured to store data and may be a non-volatile memory cell or a volatile memory cell.

Upper conductive wires 118u and upper conductive vias 116u are disposed within the upper ILD layer 402u. In some embodiments, the upper conductive wires 118u are disposed vertically above the bit lines 128. The upper conductive vias 116u extend from the upper conductive wires 118u to the word lines 120, the bit lines 128, and/or conductive wires 118 disposed within the lower region 104lr of the interconnect structure 104. Thus, the upper conductive vias 116u are configured to electrically couple the word lines 120 and/or the bit lines 128 to the semiconductor devices 106 and/or another integrated chip (not shown). By virtue of the upper conductive vias 116u contacting the top surfaces 120ts of the word lines 120 instead of contacting the bottom surfaces 120bs of the word lines 120, damage to the semiconductor devices 106 (e.g., due to accumulated charge carriers in the word lines 120) and/or the word lines 120 (e.g., due to delamination of the word lines 120) may be reduced. This, in turn, increases a performance of the integrated chip 400.

The passivation layers 406, 408 overlie the upper ILD layer 402u and the upper conductive vias and wires 116u, 118u. Further, bond pads 405 are disposed within a first passivation layer 406 and overlie corresponding upper conductive wires 118u. In some embodiments, the bond pads 405 may extend through the second passivation layer 408 and/or may comprise an opening out of view (e.g., see FIG. 4C). Furthermore, the second passivation layer 408 overlies the first passivation layer. The bond pads 405 may be configured to electrically couple the conductive wires and vias 116, 118 to other semiconductor devices disposed on another integrated chip (not shown).

Figure 4B:
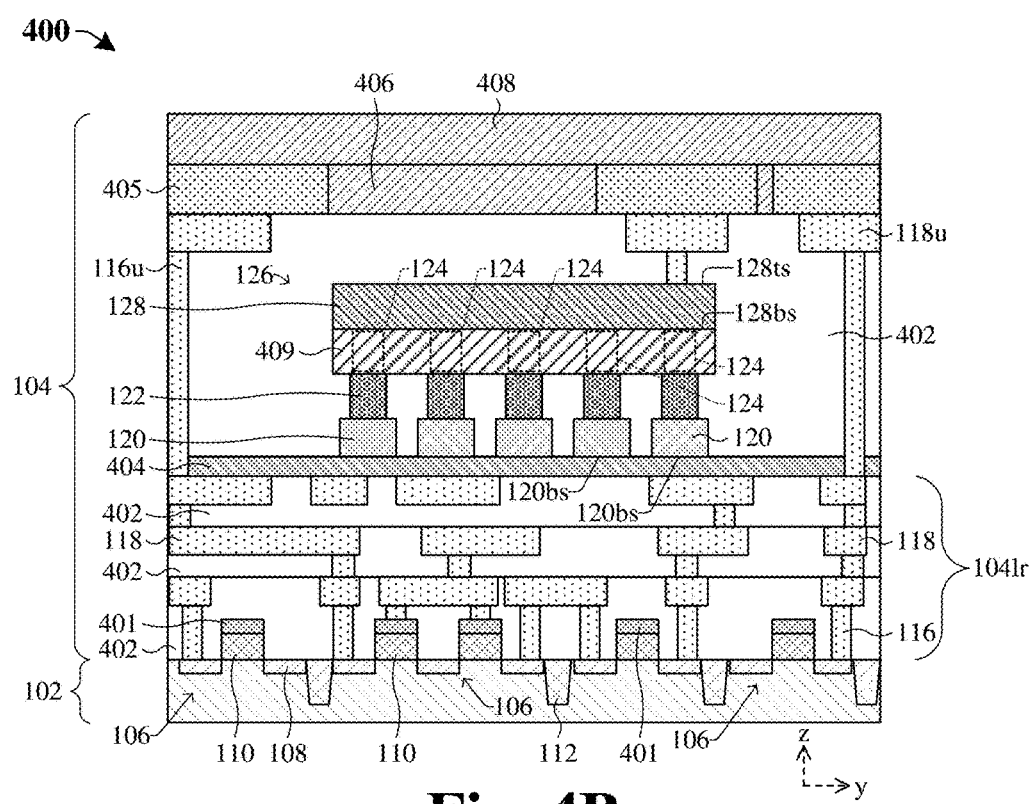

FIG. 4B illustrates a cross-sectional view of some alternative embodiments of the integrated chip 400 of FIG. 4A. In some embodiments, the cross-sectional view of FIG. 4B may be taken along the y-z plane, which is orthogonal to the x-z plane. In further embodiments, FIG. 4B illustrates a cross-sectional view of some alternative of the memory device 100 taken along line B-B' of FIG. 3.

As illustrated in the cross-sectional view of FIG. 4B, in some embodiments, a memory cell layer 409 is disposed along a bottom surface 128bs of each bit line 128. In such embodiments, the memory cell layer 409 is disposed between a bit line 128 and a corresponding column of threshold selectors 122. In further embodiments, a memory cell 124 is defined in a region of the memory cell layer 409 disposed between the bit line 128 and a corresponding threshold selector 122. In yet further embodiments, the memory cell layer 409 includes a data storage structure that is disposed between the bit line 128 and the threshold selectors 122. In some embodiments, the data storage structure may comprise, for example, a chalcogenide, an oxide, a nitride, a high-k dielectric, or some other suitable dielectric.

For example, in some embodiments, the memory cells 124 may each be configured as an RRAM cell. In such embodiments, the memory cell layer 409 has a data storage structure that may, for example, be or comprise gold and/or hafnium oxide, copper and hafnium oxide, aluminum and hafnium oxide, arsenic and hafnium oxide, gold tellurium and hafnium oxide, silicon oxide, titanium oxide, aluminum oxide (e.g., $Al_2O_3$), tantalum oxide, zirconium oxide, or another suitable material. In such embodiments, by applying appropriate bias conditions to the bit line 128 and the word lines 120, each memory cell 124 may be switched between a first state with a low resistance and a second state with a high resistance. In further embodiments, in the first state, a conductive filament may be made in the data storage structure of the memory cell layer 409 between the bit line 128 and a corresponding threshold selector 122 disposed below the memory cell layer 409. In some embodiment, the conductive filament may be confined within the dashed box illustrating the location of the corresponding memory cell 124, thereby ensuring data states of adjacent memory cells 124 are isolated from one another. In yet further embodiments, in the second state, at least a portion of the conductive filament is unmade in the memory cell layer 409 between the bit line 128 and the corresponding threshold selector 122. Each memory cell 124 may be individually switched between the first and second states as described above.

Figure 4C:
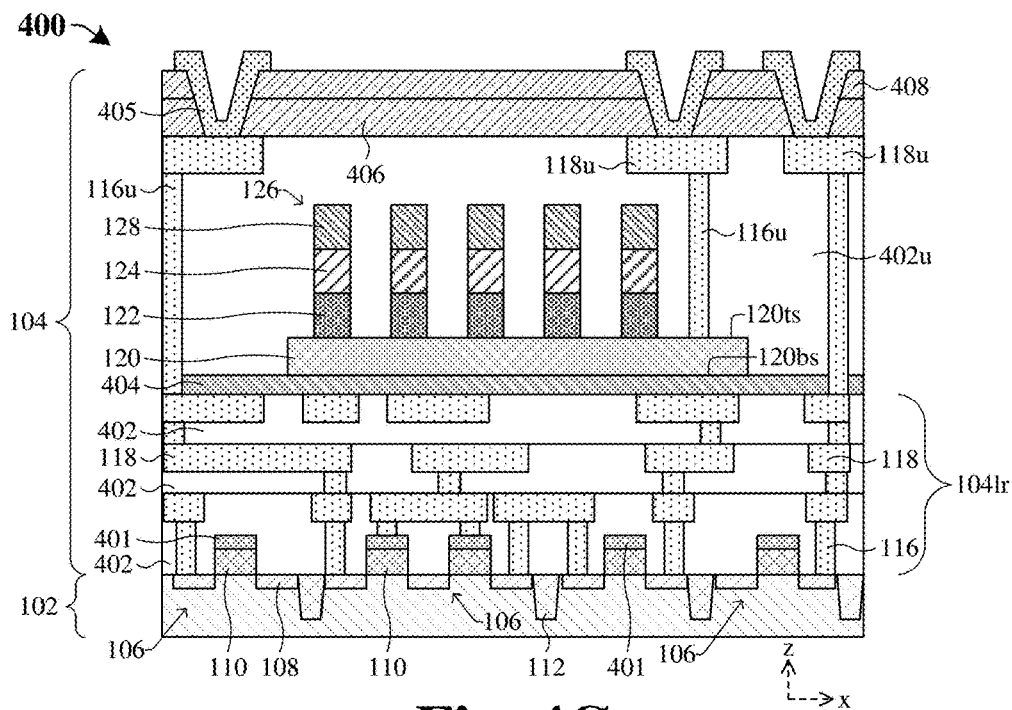

FIG. 4C illustrates a cross-sectional view of some alternative embodiments of the integrated chip 400 of FIG. 4A, in which the bond pads 405 are disposed within the first and second passivation layers 406, 408. In some embodiments, the bond pads 405 may, for example comprise aluminum and/or may be electrically coupled to another integrated chip by contact wires (not shown). It will be appreciated that the bond pads 405 comprising another material is also within the scope of the disclosure.

Figure 5:
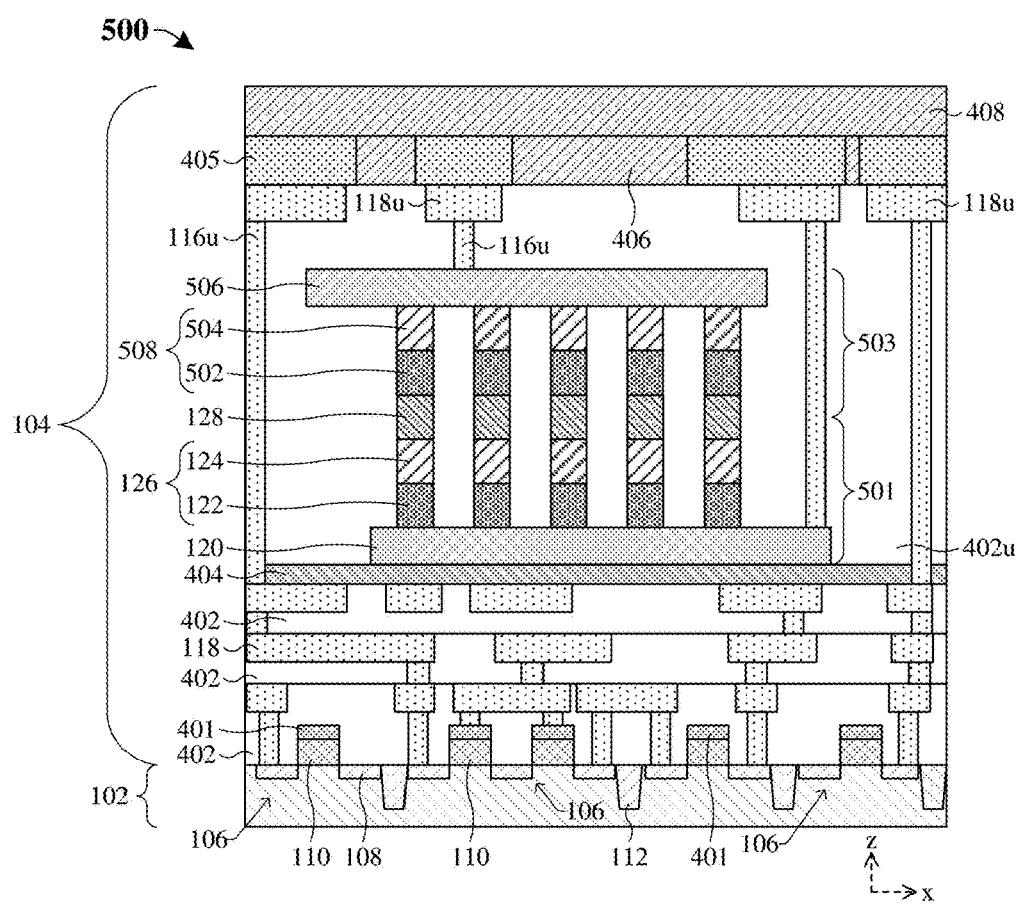
FIG. 5 illustrates a cross-sectional view of some embodiments of a three-dimensional (3D) memory array comprising a first memory array and a second memory array overlying a substrate.

FIG. 5 illustrates a cross-sectional view of some alternative embodiments of a three-dimensional (3D) memory array 500 comprising a first memory array 501 and a second memory array 503 overlying the substrate 102.

The first and second memory arrays 501, 503 are stacked, such that the second memory array 503 overlies and is spaced from the first memory array 501. In some embodiments, the first memory array 501 comprises a plurality of one selector-one memory cell (1S1MC) stacks 126 disposed between the plurality of word lines 120 and the plurality of bit lines 128. The 1S1MC stacks 126 each comprise a memory cell 124 overlying a threshold selector 122. Further, the second memory array 503 comprises a plurality of upper 1S1MC stacks 508 disposed between the plurality of bit lines 128 and a plurality of upper word lines 506. In some embodiments, the plurality of upper word lines 506 extend in parallel with the word lines 120 and/or comprise a same material as the word lines 120. In some embodiments, the plurality of upper 1S1MC stacks 508 comprise corresponding upper memory cells 504 overlying corresponding upper thresholds selector 502. In some embodiments, the upper memory cells 504 may be configured as the memory cells 124 of FIG. 1, 2, 4A, 4B, or 4C. In further embodiments, the upper threshold selectors 502 may be configured as the threshold selectors 122 of FIG. 1, 2, 4A, 4B, or 4C.

Figure 6A:
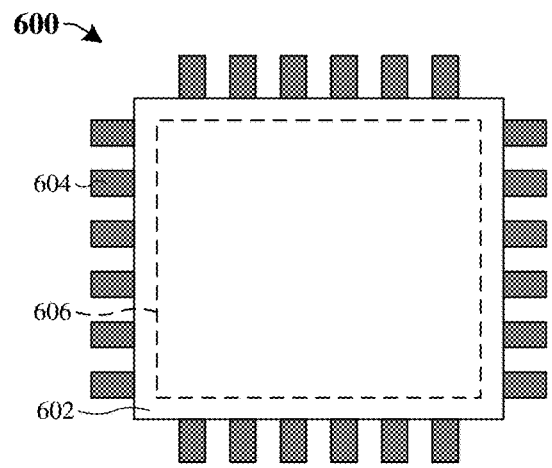
FIGS. 6A-B illustrate top views of some embodiments of package structures respectively having a standalone memory region and an embedded memory region.

FIG. 6A illustrates a top view of some embodiments of a package structure 600 including a plurality of electric connectors 604 extending from an integrated chip 602. In some embodiments, the integrated chip 602 may be configured as the memory device 100 of FIGS. 1-3. In such embodiments, the plurality of 1S1MC stacks (126 of FIGS. 1-3) are laterally disposed across the memory region 606. In further embodiments, the memory region 606 continuously extends across a majority of an area of the integrated chip 602. In yet further embodiments, the electric connectors 604 are configured to electrically couple devices disposed within the memory region 606 to another integrated chip (not shown).

In some embodiments, the memory region 606 is the only type of semiconductor region on the integrated chip 602 and/or the memory region may also be known as a standalone memory region.

Figure 6B:
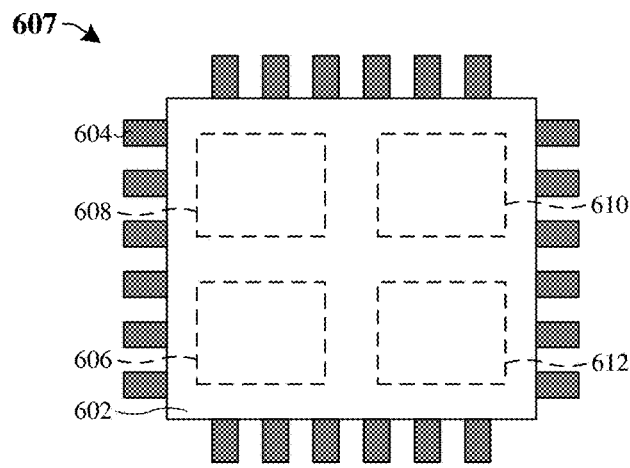

FIG. 6B illustrates a top view of some embodiments of a package structure 607 including a plurality of electric connectors 604 extending from an integrated chip 602. In some embodiments, the integrated chip 602 includes a memory region 606, a central processing unit (CPU) region 608, a static random-access memory (SRAM) region 610, and an analog region 612 that are disposed laterally adjacent to one another over a single substrate (e.g., substrate 102 of FIGS. 1 and 2). In such embodiments, the memory region 606 may also be known as an embedded memory region. In some embodiments, the plurality of 1S1MC stacks (126 of FIGS. 1-3), the word lines (120 of FIGS. 1-3), and the bit lines (128 of FIGS. 1-3) are disposed laterally within the embedded memory region 606. Further, CPU devices (not shown) are disposed laterally within the CPU region 608, SRAM devices (not shown) are disposed laterally within the SRAM region 610, and analog devices (not shown) are disposed laterally within the analog region 612. In such embodiments, the conductive vias (116 of FIGS. 1-3) and the conductive wires (118 of FIGS. 1-3) are configured to electrically couple devices disposed within the memory region 606, the CPU region 608, the SRAM region 610, and the analog region 612 to one another. Further, the electric connectors 604 may be electrically coupled to the conductive vias (116 of FIGS. 1-3) and the conductive wires (118 of FIGS. 1-3).

Figure 7:
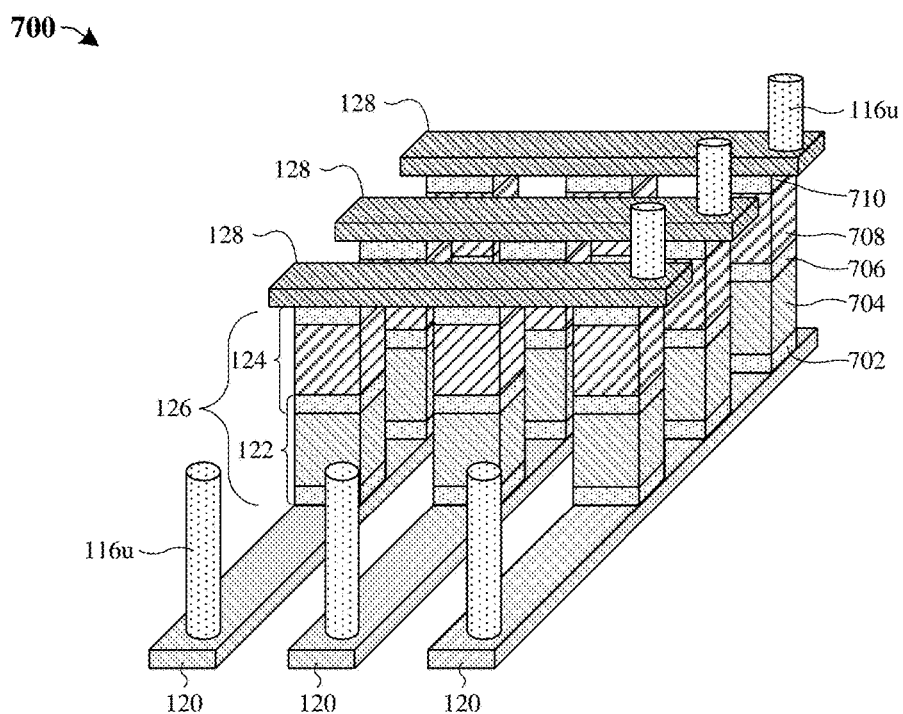
FIG. 7 illustrates a perspective view of some embodiments of a section of the memory device of FIGS. 1-3.

FIG. 7 illustrates a perspective view of some embodiments of a memory device 700 including a plurality of 1S1MC stacks 126 disposed between a plurality of bit lines 128 and a plurality of word lines 120.

In some embodiments, the 1S1MC stacks 126 include corresponding memory cells 124 overlying corresponding threshold selectors 122. In some embodiments, a 1S1MC stack 126 includes a lower electrode 702, a middle electrode 706, a threshold selector layer 704 disposed between the lower and middle electrodes 702, 706, an upper electrode 710, and a data storage structure 708 disposed between the middle and upper electrodes 706, 710. The lower electrode 702, the middle electrode 706, and the threshold selector layer 704 define a threshold selector 122. The middle electrode 706, the upper electrode 710, and the data storage structure 708 define a memory cell 124. In some embodiments, the upper, middle, and lower electrodes 702, 706, 710 may, for example, respectively be or comprise tungsten, titanium, tantalum, another conductive material, or any combination of the foregoing.

The 1S1MC stacks 126 are arranged within a memory array comprising rows and/or columns. 1S1MC stacks 126 within a row of the memory array are operably coupled to a word line 120, while 1S1MC stacks 126 within a column of the memory array are operably coupled to a bit line 128. This causes the plurality of 1S1MC stacks 126 to be respectively associated with an address defined by an intersection of a word line and a bit line. In some embodiments, the memory array is coupled to support circuitry that is configured to read from and/or write to the plurality of 1S1MC stacks 126 by way of the upper conductive vias 116u. In some embodiments, the support circuitry comprises a bit line (BL) decoder (not shown), a control unit (not shown), a word line (WL) decoder (not shown), and/or access devices (not shown). In some embodiments, the control unit is a microprocessor unit. In further embodiments, the access devices may be the semiconductor devices (e.g., 106 of FIGS. 1-2).

In some embodiments, during operation of the memory device 700, the control unit may supply an address to the WL decoder and/or the BL decoder. The address is associated with a single 1S1MC stack 126 within the memory array. The WL decoder is configured to selectively apply a signal (e.g., a current and/or voltage) to one or more of the word lines 120 based upon the received address. In addition, the BL decoder is configured to selectively apply a signal (e.g., a current and/or voltage) to one or more of the bit lines 128 based upon the received address. For example, during a read operation of the memory device 700, the BL decoder is configured to apply a read voltage to one of the plurality of bit lines 128, such that an output of at least one 1S1MC stack 126 may be accessed (e.g., at a source line). In further embodiments, during a write operation, the WL decoder is configured to apply a write voltage to at least one of the plurality of word lines 120 such that a resistive value of at least one 1S1MC stack 126 may be set and/or changed.

FIGS. 8-19 illustrate cross-sectional views 800-1900 of some embodiments of a method for forming a memory device having a plurality of memory cells disposed between overlying bit lines and underlying word lines in an interconnect structure, where an upper conductive via extends from above the bit lines to a top surface of a corresponding word line. Although the cross-sectional views 800-1900 shown in FIGS. 8-19 are described with reference to a method, it will be appreciated that the structures shown in FIGS. 8-19 are not limited to the method but rather may stand alone separate from the method. Although FIGS. 8-19 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 8:
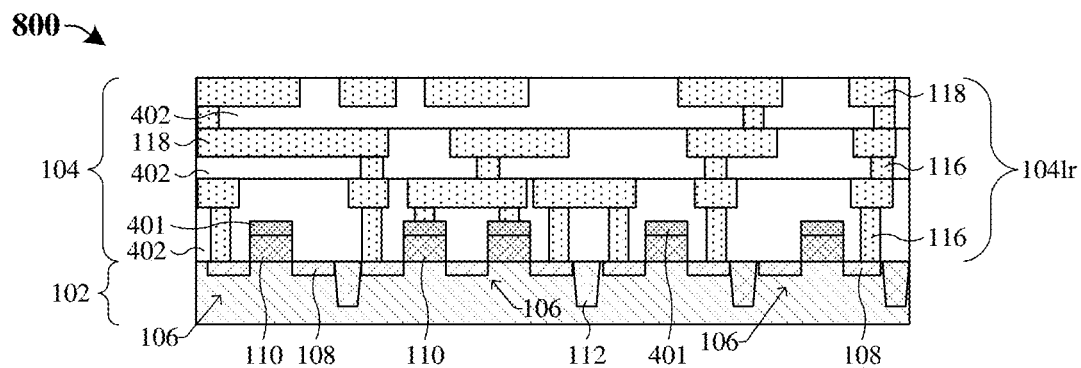
FIGS. 8-19 illustrate a series of cross-sectional views of some embodiments of a method for forming a memory device having a plurality of memory cells disposed between overlying bit lines and underlying word lines in an interconnect structure, where an upper conductive via extends from above the bit lines to a top surface of a corresponding word line.

As shown in cross-sectional view 800 of FIG. 8, a substrate 102 is provided and isolation structures 112 are formed within the substrate 102. In some embodiments, the substrate 102 may, for example, be a bulk substrate (e.g., a bulk silicon substrate), a silicon on insulator (SOI) substrate, or some other suitable substrate and/or may comprise a first doping type (e.g., p-type). In some embodiments, a process for forming the isolation structures 112 may include: 1) selectively etching the substrate 102 to form trenches in the substrate 102; and 2) filling (e.g., by chemical vapor deposition (CVD), physical vapor deposition (PVD), atomic layer deposition (ALD), thermal oxidation, etc.) the trenches with a dielectric material (e.g., silicon dioxide, silicon nitride, silicon carbide, etc.). In further embodiments, the substrate 102 is selectively etched by forming a masking layer (not shown) over the substrate 102, and subsequently exposing the substrate 102 to an etchant configured to selectively remove unmasked portions of the substrate 102.

Also shown in FIG. 8, semiconductor devices 106 are formed over and/or within the substrate 102. In some embodiments, the semiconductor devices 106 are configured as transistors. In such embodiments, a process for forming the semiconductor devices 106 may include deposition and/or growing (e.g., by CVD, PVD, ALD, thermal oxidation, etc.) a gate dielectric layer on a top surface of the substrate 102. Next, a gate electrode layer may be deposited on the gate dielectric layer. Subsequently, the gate dielectric and electrode layers are patterned (e.g., by a photolithography/etching process) to form gate dielectrics and gate electrodes, respectively, thereby defining the gate structure 110. In further embodiments, a gate capping layer 401 is formed and/or grown over the gate electrode of the gate structure 110. Further, source/drain regions 108 are formed on opposing sides of the gate structures 110, thereby defining the semiconductor devices 106. In some embodiments, the source/drain regions 108 may be formed by a selective ion implantation that utilizes a masking layer (not shown) disposed on the top surface of the substrate 102 to selectively implant dopants of a second doping type (e.g., n-type dopants) into the substrate 102. In some embodiments, the second doping type is opposite the first doping type. In some embodiments, the gate electrode layer may comprise, for example, polysilicon, aluminum, titanium, another suitable conductive material, or any combination of the foregoing. In further embodiments, the gate dielectric layer may comprise, for example, silicon dioxide, another suitable oxide, a high-k dielectric material, another suitable dielectric material, or any combination of the foregoing. In yet further embodiments, the gate capping layer 401 may comprise, for example, tantalum, titanium, titanium nitride, tantalum nitride, another suitable material, or any combination of the foregoing.

In addition, as shown in FIG. 8, a lower region 104lr of an interconnect structure 104 is formed over the substrate 102. The lower region 104lr of the interconnect structure 104 includes a plurality of inter-level dielectric (ILD) layers 402, a plurality of conductive vias 116, and a plurality of conductive wires 118. In some embodiments, the ILD layers 402 may, for example, be deposited by CVD, PVD, ALD, or another suitable growth or deposition process. Further, the ILD layers 402 may, for example, be or comprise silicon dioxide, a low-k dielectric material, another suitable material, or any combination of the foregoing. Further, in some embodiments, the plurality of conductive vias 116 and the plurality of conductive wires 118 may be formed by a single damascene process or a dual damascene process. In further embodiments, the plurality of conductive vias and/or wires 116, 118 may, for example, respectively be or comprise copper, aluminum, titanium nitride, tantalum nitride, another suitable conductive material, or any combination of the foregoing.

Figure 9:
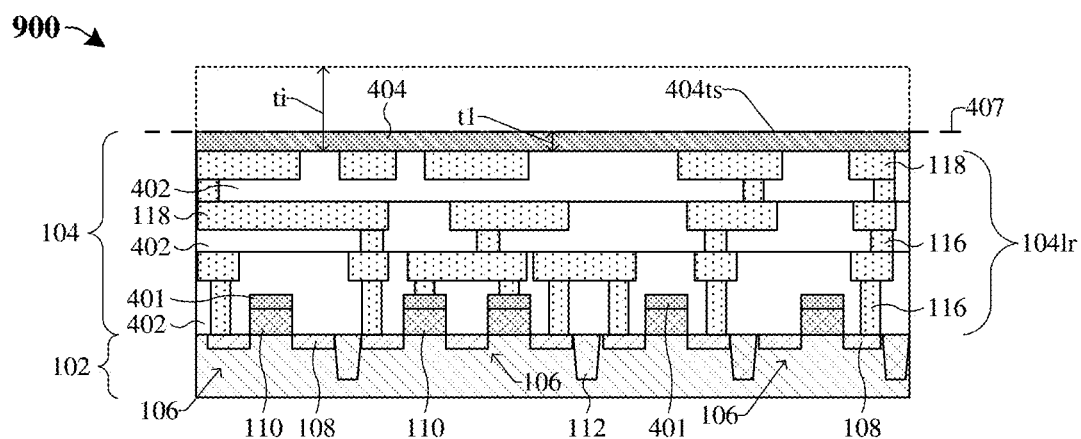

As shown in cross-sectional view 900 of FIG. 9, an etch stop layer 404 is formed along an upper surface of a topmost ILD layer 402 in the lower region 104lr of the interconnect structure 104. In some embodiments, the etch stop layer 404 may, for example, be formed by CVD, PVD, ALD, or another suitable growth or deposition process. In further embodiments, the etch stop layer 404 may, for example, be or comprise silicon nitride, silicon carbide, silicon oxynitride, silicon oxycarbide, an extreme low k (ELK) dielectric material, another suitable dielectric material, or any combination of the foregoing. An ELK dielectric material may, for example, be a dielectric having a dielectric constant less than about 2.5, about 2.0, or some other suitable value.

In further embodiments, a process for forming the etch stop layer 404 may include: 1) depositing (e.g., by a CVD process) a dielectric material (e.g., an oxide, such as silicon dioxide, a low-k dielectric material, etc.) over the topmost ILD layer 402 in the lower region 104lr of the interconnect structure 104; and 2) performing a planarization process (e.g., a CMP process) into the dielectric material to thin the etch stop layer 404 and to flatten or substantially flatten a top surface 404ts of the etch stop layer 404. In some embodiments, the flattened or substantially flattened top surface is within a tolerance of a CMP process. In some embodiments, the dielectric material is deposited so an initial thickness ti of the etch stop layer 404 is within a range of about 3,000 to 5,000 Angstroms before the planarization process. It will be appreciated that other values for the initial thickness ti are also within the scope of the disclosure. In some embodiments, after the planarization process, the etch stop layer 404 has a thickness t1 that is about 1,000 Angstroms or within a range of about 100 to 1,000 Angstroms. It will be appreciated that other values for the thickness t1 are also within the scope of the disclosure. In some embodiments, at any point a height of the top surface 404ts of the etch stop layer 404 varies within a range of about −5% to +5% of the thickness t1 from a level horizontal line 407 located along the top surface 404ts of the etch stop layer 404. For example, if the thickness t1 is about 1,000 Angstroms, then the height of the top surface 404ts of the etch stop layer 404 varies within a range of about −50 Angstroms to +50 Angstroms from the level horizontal line 407. In other embodiments, at any point the height of the top surface 404ts of the etch stop layer 404 varies within a range of about −5 Angstroms to +5 Angstroms from the level horizontal line 407. It will be appreciated that other values for the height of the top surface 404ts of the etch stop layer 404 varying from the level horizontal line 407 are also within the scope of the disclosure.

Figure 10:
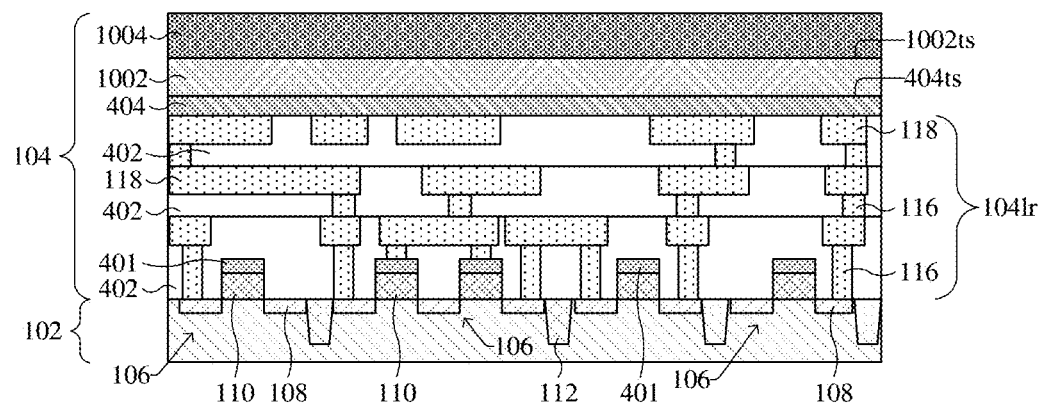

As shown in cross-sectional view 1000 of FIG. 10, a word line layer 1002 is deposited over the etch stop layer 404, and a threshold selector layer 1004 is deposited along the word line layer 1002. In some embodiments, the word line layer 1002 and/or the threshold selector layer 1004 are deposited by, for example, CVD, PVD, ALD, or another suitable deposition or growth process. In further embodiments, the word line layer 1002 may, for example, be or comprise copper, aluminum, tungsten, titanium nitride, tantalum nitride, another suitable conductive material, or any combination of the foregoing.

In some embodiments, the word line layer 1002 is deposited along the top surface 404ts of the etch stop layer 404, thereby ensuring a top surface 1002ts of the word line layer 1002 is substantially flat (e.g., a flat top surface within a tolerance of a CMP process). In some embodiments, the word line layer 1002 may comprise a single material, such as tungsten. The single material may have a relatively high hardness, such that the substantially flat top surface 404ts of the etch stop layer 404 prevents stress in the word line layer 1002. This, in part, mitigates delamination of the word line layer 1002 and layers and/or structures formed over the word line layer 1002 (e.g., the threshold selector layer 1004).

Figure 11:
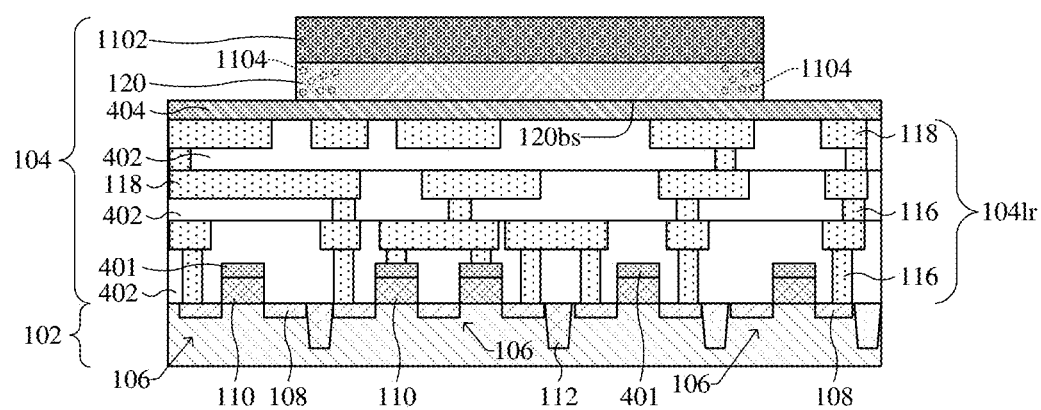

As shown in cross-sectional view 1100 of FIG. 11, a patterning process is performed on the word line layer (1002 of FIG. 10) and the threshold selector layer (1004 of FIG. 10), thereby defining a word line(s) 120 and threshold selector line(s) 1102. In some embodiments, the patterning process includes: 1) forming a masking layer (not shown) over the threshold selector layer (1004 of FIG. 10); 2) performing a dry etch process on the threshold selector layer (1004 of FIG. 10) and the word line layer (1002 of FIG. 10) according to the masking layer, thereby defining the word line(s) 120 and the threshold selector line(s); 3) and performing a removal process to remove the masking layer. In some embodiments, the word line layer (1002 of FIG. 10) is patterned such that a plurality of word lines 120 are formed that each extend laterally in a first direction (e.g., along the x-axis), as illustrated and described in FIGS. 1-3. In such embodiments, the word lines 120 are arranged in parallel with one another.

In some embodiments, the dry etch process includes performing a reactive-ion etch with a plasma. Due to a power of the reactive-ion etch and/or the plasma, charge carriers 1104 (e.g., electrons) may be injected into the word lines 120. Due to a relatively long length of the word lines 120, a large amount of charge carriers 1104 may build up in each word line 120. Because the conductive wires 118 and conductive vias 116 within the lower region 104lr of the interconnect structure 104 are offset from the bottom surface 120bs of the word lines 120, the word lines 120 are electrically isolated from the semiconductor devices 106. This prevents the large amount of charge carriers 1104 within the word lines 120 from traveling to the semiconductor devices 106, thereby preventing breakdown of the semiconductor devices 106. In addition, because the conductive vias and wires 116, 118 within the lower region 104lr are offset from the bottom surface 120bs of the word lines 120, galvanic corrosion may not occur between the word lines 120 and the conductive vias and wires 116, 118. This further mitigates delamination of the word lines 120 and layers and/or structures subsequently formed over the word lines 120.

Figure 12:
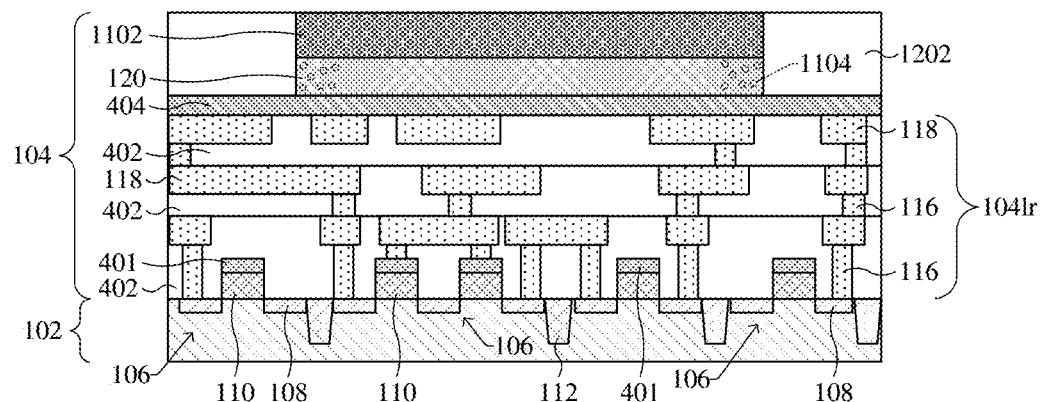

As shown in cross-sectional view 1200 of FIG. 12, a dielectric structure 1202 is formed around the word line 120 and the threshold selector line 1102. In some embodiments, a process for forming the dielectric structure 1202 includes: 1) depositing (e.g., by CVD, PVD, ALD, etc.) a dielectric material (e.g., silicon dioxide, a low-k dielectric material, or the like) over the word line 120 and the threshold selector line 1102; and 2) performing a planarization process (e.g., a CMP process) into the dielectric material until an upper surface of the threshold selector line 1102 is reached, thereby defining the dielectric structure 1202.

Figure 13:
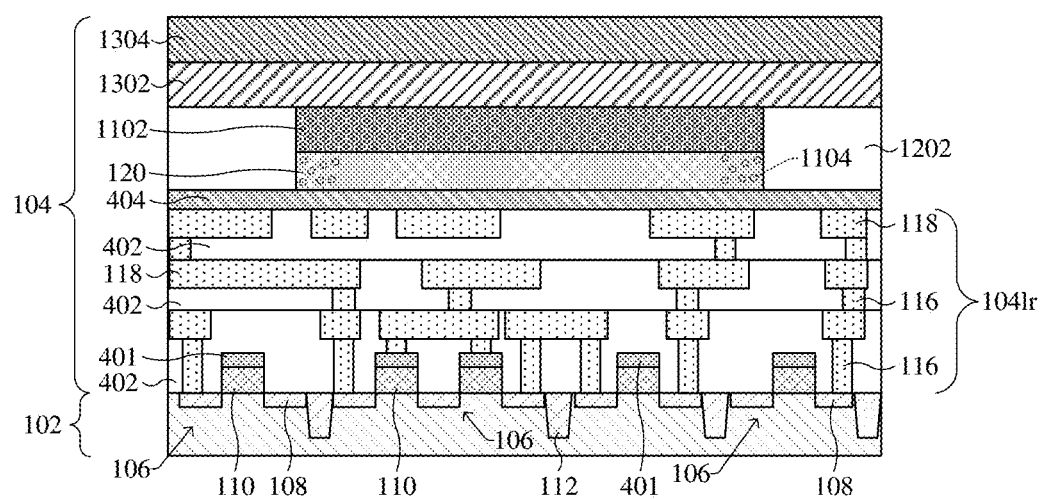

As shown in cross-sectional view 1300 of FIG. 13, a memory cell film 1302 is formed over the threshold selector line 1102, and a bit line layer 1304 is formed over the memory cell film 1302. In some embodiments, the memory cell film 1302 may be formed by, for example, one or more deposition processes such as PVD, ALD, sputtering, CVD, electroless plating, electroplating, or another suitable deposition or growth process. In further embodiments, the bit line layer 1304 may be formed, for example, by CVD, PVD, ALD, sputtering, or another suitable deposition or growth process. In some embodiments, the bit line layer 1304 may, for example, be or comprise aluminum, copper, titanium nitride, tantalum nitride, tungsten, another suitable conductive material, or any combination of the foregoing.

Figure 14:
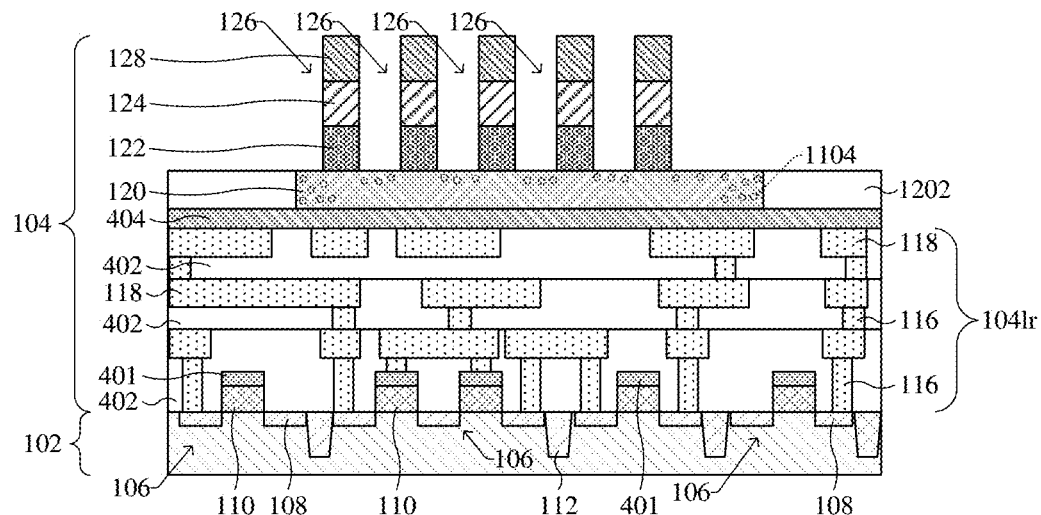

As shown in cross-sectional view 1400 of FIG. 14, a patterning process is performed on the structure of FIG. 13, thereby defining a plurality of one selector-one memory cell (1S1MC) stacks 126 and a plurality of bit lines 128. In some embodiments, FIG. 4B illustrates alternative embodiments of an orthogonal view of the cross-sectional view 1400 of FIG. 14. For example, FIG. 3 may illustrate a top view of FIG. 14, such that the cross-sectional view 1400 of FIG. 14 is taken along the line A-A' of FIG. 3, and the cross-sectional view of FIG. 4B may be taken along the line B-B' of FIG. 3. Each 1S1MC stack 126 includes a memory cell 124 overlying a threshold selector 122. In some embodiments, the 1S1MC stacks 126 include memory cell layers (e.g., 409 of FIG. 4B), each with multiple memory cells 124, and threshold selectors 122 underlying the memory cell layer (e.g., 409 of FIG. 4B). The plurality of 1S1MC stacks 126 are disposed between the word line 120 and the plurality of bit lines 128. The plurality of bit lines 128 each extend laterally in a second direction (e.g., along the y-axis) transverse the first direction. In some embodiments, the patterning process includes: 1) forming a masking layer (not shown) over the bit line layer (1304 of FIG. 13); 2) exposing unmasked regions of the bit line layer (1304 of FIG. 13), the memory cell film (1302 of FIG. 13), the threshold selector line (1102 of FIG. 13), and the dielectric structure 1202 to one or more etchants, thereby defining the plurality of 1S1MC stacks 126 and the plurality of bit lines 128; and 3) performing a removal process to remove the masking layer.

In further embodiments, the patterning process performed on the structure of FIG. 13 may include performing a reactive-ion etch with a plasma. Due to a power of the reactive-ion etch and/or the plasma, additional charge carriers 1104 may be injected into the word lines 120.

Figure 15:
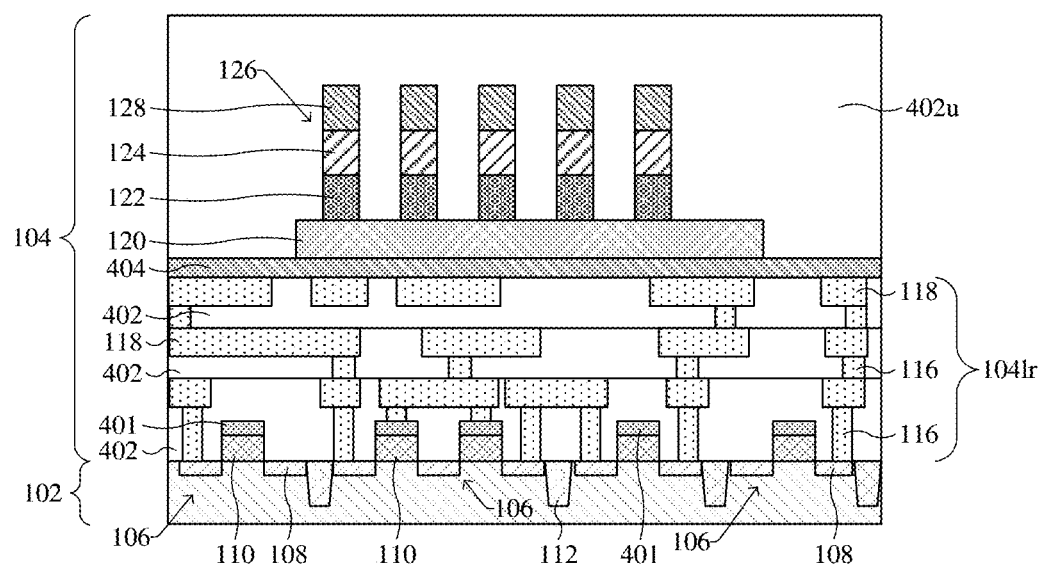

As shown in cross-sectional view 1500 of FIG. 15, an upper ILD layer 402u is formed over the plurality of 1S1MC stacks 126. In some embodiments, a process for forming the upper ILD layer 402u includes: 1) depositing (e.g., by PVD, CVD, etc.) a dielectric material (e.g., silicon dioxide, a low-k dielectric material, etc.) over the 1S1MC stacks 126; and 2) performing a planarization process (e.g., a CMP process) into the dielectric material, thereby defining the upper ILD layer 402u. In some embodiments, the upper ILD layer 402u is formed between adjacent 1S1MC stacks 126, thereby facilitating electrical isolation between adjacent 1S1MC stacks 126.

In further embodiments, before forming the upper ILD layer 402u, a charge carrier removal process is performed on the word lines 120 to remove the charge carriers (1104 of FIG. 14) from the word lines 120. In some embodiments, the charge carrier removal process may include exposing the word lines 120 to ultra-violet (UV) light to eject the charge carriers (1104 of FIG. 14) from the word lines 120, electrically coupling the word lines 120 to ground such that the charge carriers (1104 of FIG. 14) are removed from the word lines 120, another suitable charge carrier removal process, or any combination of the foregoing. In some embodiments, exposing the word lines 120 to UV light may remove charge carriers (1104 of FIG. 14) from the word lines 120 through the photoelectric effect.

Figure 16:
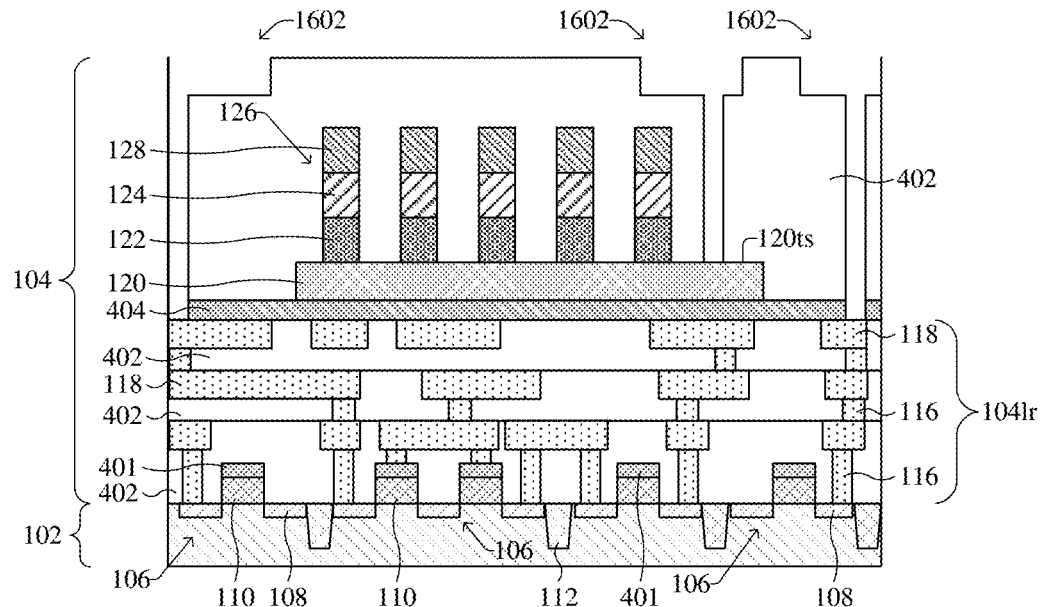

As shown in cross-sectional view 1600 of FIG. 16, a patterning process is performed on the upper ILD layer 402u and the etch stop layer 404 to define a plurality of conductive feature openings 1602. In some embodiments, the patterning process includes: 1) forming a masking layer (not shown) over an upper surface of the upper ILD layer 402u; 2) exposing unmasked regions of the upper ILD layer 402u and the etch stop layer 404 to one or more etchants, thereby defining the plurality of conductive feature openings 1602; and 3) performing a removal process to remove the masking layer. In some embodiments, the plurality of conductive feature openings 1602 each include a conductive wire opening overlying a conductive via opening. Further, a conductive feature opening 1602 exposes at least a portion of a top surface 120ts of the word line 120.

Figure 17:
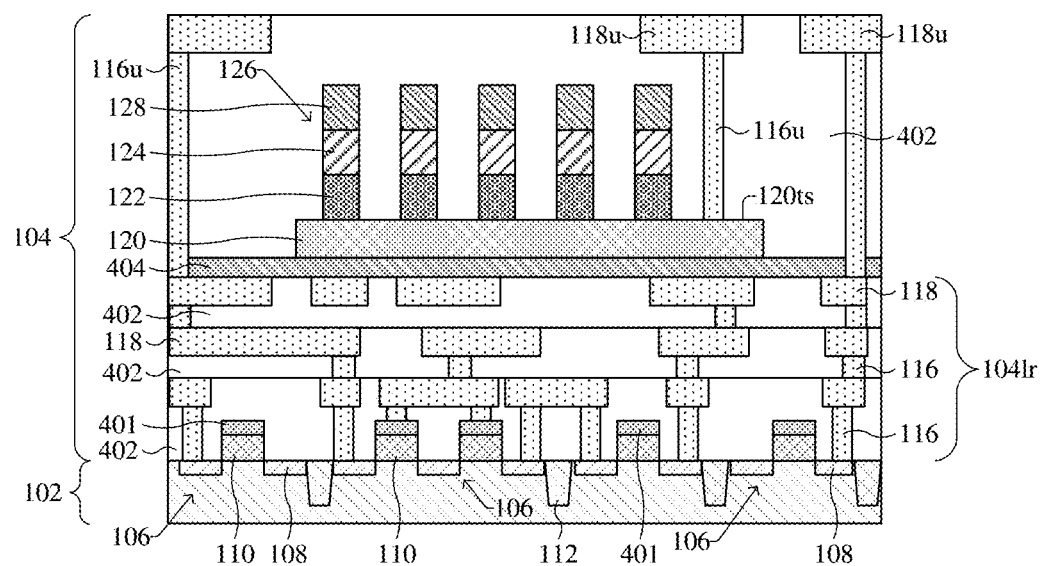

As shown in cross-sectional view 1700 of FIG. 17, a plurality of upper conductive vias 116u and a plurality of upper conductive wires 118u are formed within the conductive feature openings (1602 of FIG. 16). In some embodiments, a process for forming the upper conductive vias and wires 116u, 118u includes: 1) depositing (e.g., by CVD, PVD, sputtering, electroless plating, electroplating, etc.) a conductive structure within the conductive feature openings (1602 of FIG. 16); and 2) performing a planarization process (e.g., a CMP process) into the conductive structure until an upper surface of the upper ILD layer 402u is reached, thereby defining the upper conductive vias and wires 116u, 118u. In further embodiments, an upper conductive via 116u directly overlies the top surface 120ts of the word line 120 and extends continuously from an upper conductive wire 118u to abut the top surface 120ts of the word line 120. In some embodiments, the upper conductive via 116u directly contacts the top surface 120ts of the word line 120. In yet further embodiments, the upper conductive wires 118u are electrically coupled to the conductive vias and/or wires 116, 118 disposed within the lower region 104lr of the interconnect structure 104. Further, in some embodiments, an upper conductive via 116u abuts an upper surface of each bit line 128 (not shown) (e.g., see FIGS. 2-3). By virtue of the upper conductive vias 116u being formed after the word line 120, a conductive path is formed between the word line 120 and a corresponding semiconductor device 106 after forming the bit lines 128. In some embodiments, charge carriers (e.g., electrons) accumulated in the word line 120 may be dispersed before forming the conductive path (e.g., by performing the charge carrier removal process, described in FIG. 15, before forming the conductive path). This reduces breakdown of the semiconductor devices 106.

Figure 18:
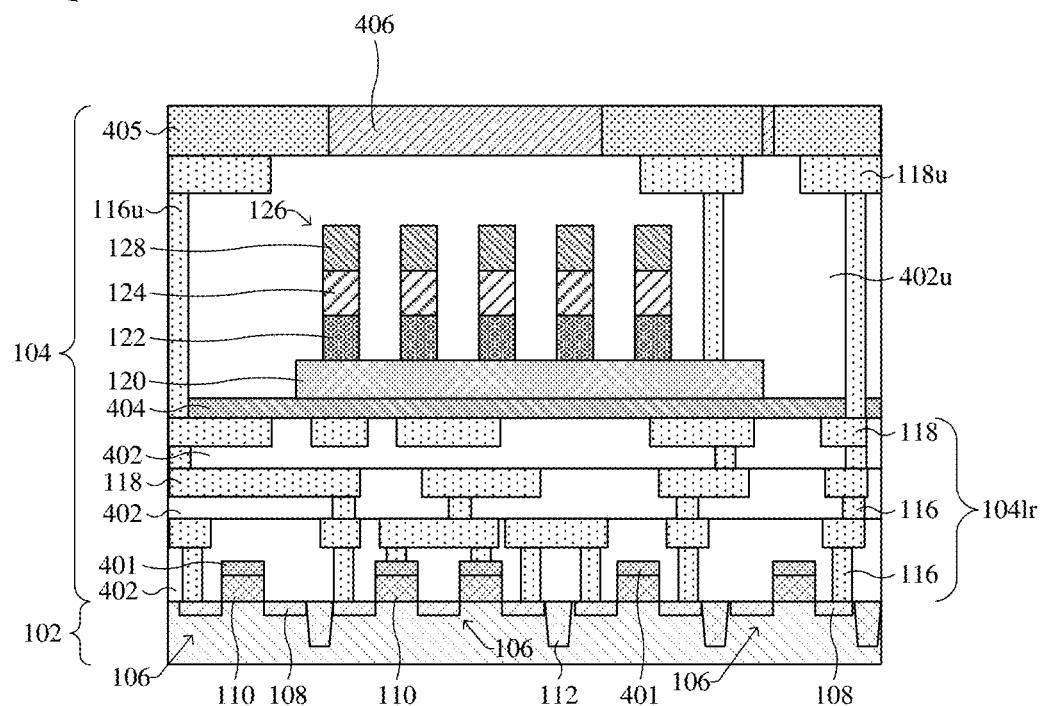

As shown in cross-sectional view 1800 of FIG. 18, a first passivation layer 406 is formed over the upper ILD layer 402u, and a plurality of bond pads 405 are formed within the first passivation layer 406. The bond pads 405 are formed over a corresponding upper conductive wire 118u. In some embodiments, the first passivation layer 406 may, for example, be deposited by CVD, PVD, ALD, or another suitable deposition process. In further embodiments, the bond pads 405 may be formed, for example, by CVD, PVD, sputtering, electroless plating, electroplating, or another suitable deposition or growth process.

Figure 19:
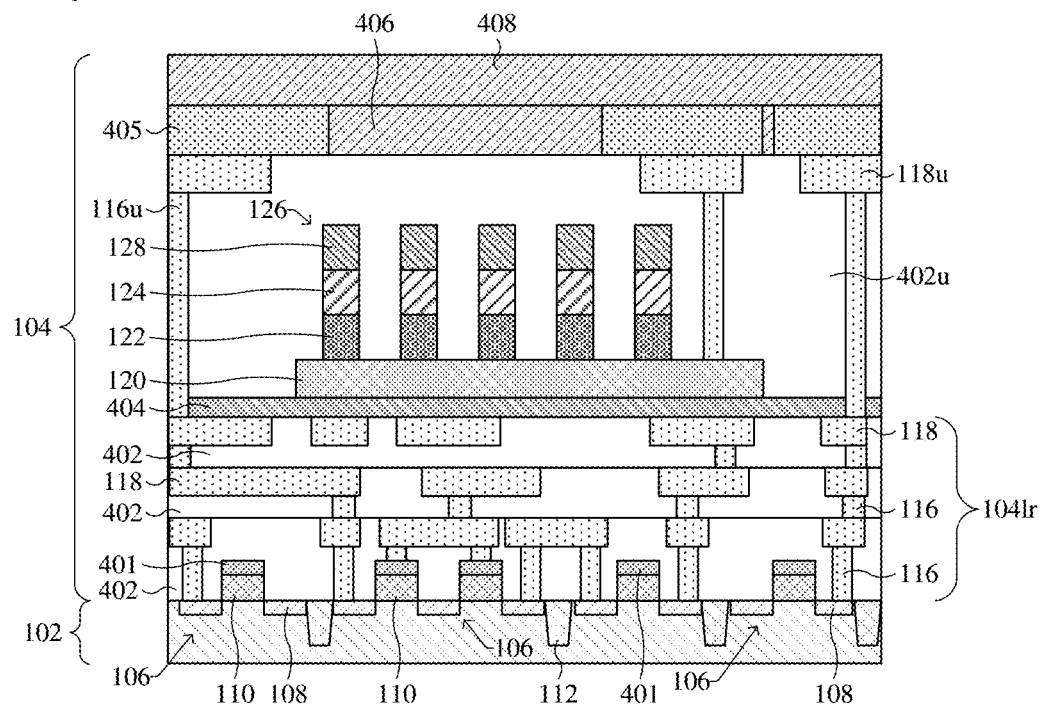

As shown in cross-sectional view 1900 of FIG. 19, a second passivation layer 408 is formed over the first passivation layer 406. In some embodiments, the second passivation layer 408 may be formed, for example, by CVD, PVD, ALD, or another suitable deposition process.

Figure 20:
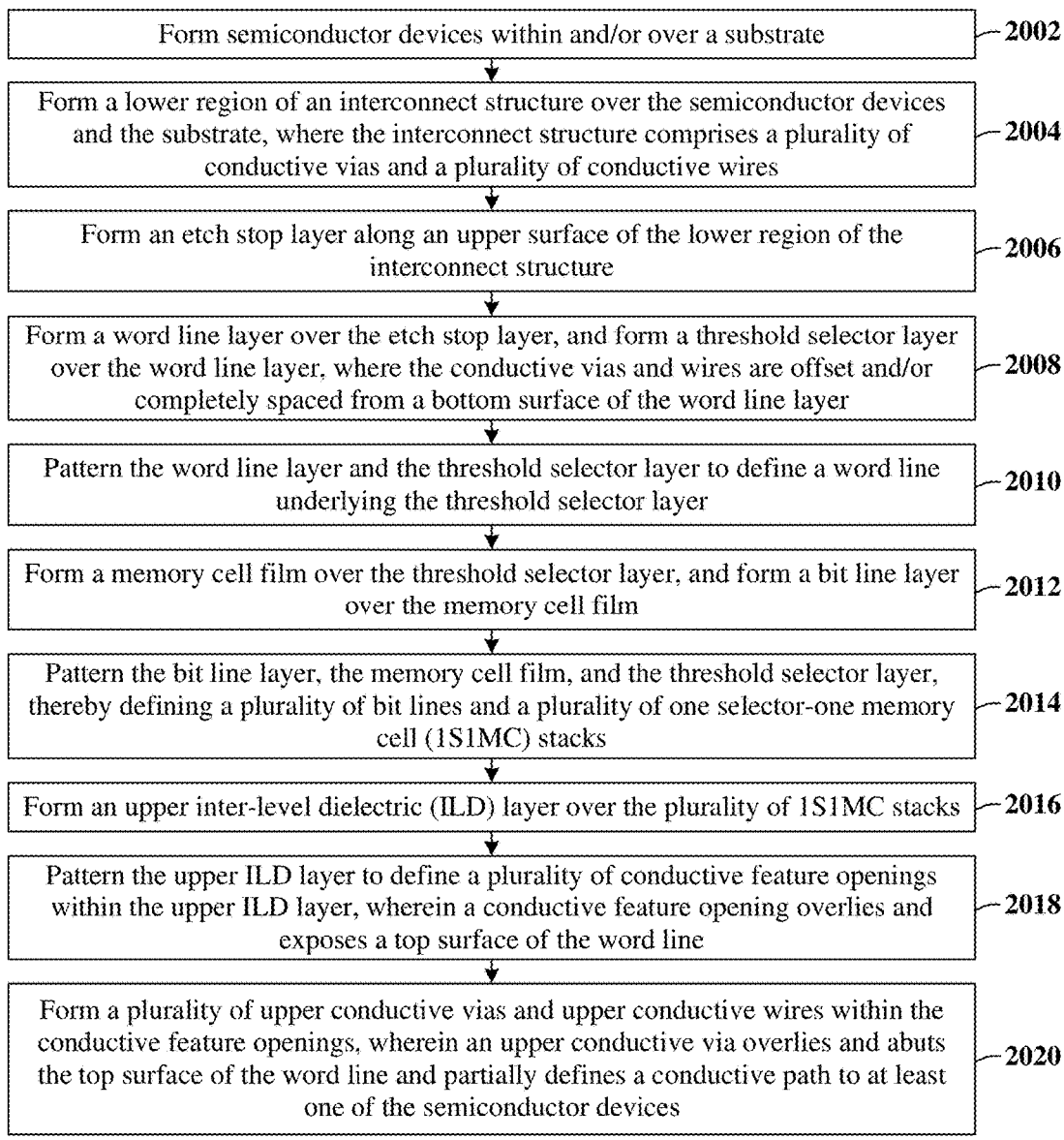
FIG. 20 illustrates a block diagram of some embodiments of the method of FIGS. 8-19.

FIG. 20 illustrates a method 2000 of some embodiments for forming a memory device having a plurality of memory cells disposed between overlying bit lines and underlying word lines in an interconnect structure, where an upper conductive via extends from above the bit lines to a top surface of a corresponding word line according to the present disclosure. Although the method 2000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted and other un-illustrated acts or events may be included.

At act 2002, semiconductor devices are formed within and/or over a substrate. FIG. 8 illustrates a cross-sectional view 800 corresponding to some embodiments of act 2002.

At act 2004, a lower region of an interconnect structure is formed over the semiconductor devices and the substrate. The interconnect structure comprises a plurality of conductive vias and a plurality of conductive wires. FIG. 8 illustrates a cross-sectional view 800 corresponding to some embodiments of act 2004.

At act 2006, an etch stop layer is formed along an upper surface of the lower region of the interconnect structure. FIG. 9 illustrates a cross-sectional view 900 corresponding to some embodiments of act 2006.

At act 2008, a word line layer is formed over the etch stop layer, and a threshold selector layer is formed over the word line layer. The conductive vias and wires are offset and/or completely spaced from a bottom surface of the word line layer. FIG. 10 illustrates a cross-sectional view 1000 corresponding to some embodiments of act 2008.

At act 2010, the word line layer and the threshold selector layer are patterned to define a word line underlying a threshold selector line. FIG. 11 illustrates a cross-sectional view 1100 corresponding to some embodiments of act 2010.

At act 2012, a memory cell film is formed over the threshold selector line, and a bit line layer is formed over the memory cell film. FIG. 13 illustrates a cross-sectional view 1300 corresponding to some embodiments of act 2012.

At act 2014, the bit line layer, the memory cell film, and the threshold selector line are patterned, thereby defining a plurality of bit lines and a plurality of one selector-one memory cell (1S1MC) stacks. FIG. 14 illustrates a cross-sectional view 1400 corresponding to some embodiments of act 2014.

At act 2016, an upper inter-level dielectric (ILD) layer is formed over the plurality of 1S1MC stacks. FIG. 15 illustrates a cross-sectional view 1500 corresponding to some embodiments of act 2016.

At act 2018, the upper ILD layer is patterned to define a plurality of conductive feature openings within the upper ILD layer. A conductive feature opening overlies and exposes a top surface of the word line. FIG. 16 illustrates a cross-sectional view 1600 corresponding to some embodiments of act 2018.

At act 2020, a plurality of upper conductive vias and upper conductive wires are formed within the conductive feature openings. An upper conductive via overlies and abuts the top surface of the word line and partially defines a conductive path to at least one of the semiconductor devices. FIG. 17 illustrates a cross-sectional view 1700 corresponding to some embodiments of act 2020.

Accordingly, in some embodiments, the present disclosure is related towards a memory device having a plurality of memory cells disposed between overlying bit lines and underlying word lines in an interconnect structure, where an upper conductive via extends from above the memory cells to a top surface of a corresponding word line.

In some embodiments, the present application provides an integrated chip including: a substrate; an array overlying the substrate and comprising multiple memory stacks in a plurality of rows and a plurality of columns, wherein each of the memory stacks comprises a data storage structure having a variable resistance; a plurality of word lines disposed beneath the array and extending along corresponding rows of the array, wherein the word lines are electrically coupled with memory stacks of the array in the corresponding rows; and a plurality of upper conductive vias extending from above the array of memory stacks to contact top surfaces of corresponding word lines. In an embodiment, the integrated chip further includes an interconnect dielectric structure overlying the substrate, wherein the memory stacks, the word lines, and the upper conductive vias are disposed within the interconnect dielectric structure, and wherein the interconnect dielectric structure directly contacts a bottom surface of each word line across an entirety of the bottom surface. In an embodiment, the bottom surface of each word line is defined between a first outer sidewall of a corresponding word line and a second outer sidewall of the corresponding word line, wherein the first outer sidewall is opposite the second outer sidewall, and wherein the interconnect dielectric structure continuously laterally extends along an unbroken path from the first outer sidewall to the second outer sidewall. In an embodiment, the integrated chip further includes multiple bit lines disposed above the array and extending along corresponding columns of the array, wherein the bit lines are electrically coupled with memory stacks of the array in the corresponding columns. In an embodiment, a top surface of the plurality of upper conductive vias is disposed above the bit lines. In an embodiment, the memory stacks include corresponding memory cells overlying corresponding threshold selectors. In an embodiment, a bottom surface of one of the threshold selectors is disposed along a top surface of an underlying word line. In an embodiment, a width of the word lines is greater than a width of the memory stacks. In an embodiment, the word lines comprise a first material and the upper conductive vias comprise a second material different than the first material.

In some embodiments, the present application provides an integrated chip including: a substrate; an interconnect structure overlying the substrate, wherein the interconnect structure includes a plurality of conductive wires and a plurality of conductive vias disposed within a dielectric structure, an array of memory stacks disposed within the dielectric structure in a plurality of rows and a plurality of columns, wherein the memory stacks respectively include memory cells overlying selectors; a plurality of bit lines disposed within the dielectric structure and extending along corresponding columns of the array in a first direction, wherein the bit lines overlie the memory stacks and are electrically coupled with memory cells of the array in the corresponding columns; a plurality of word lines disposed within the dielectric structure and extending along corresponding rows of the array in a second direction, wherein the second direction is orthogonal to the first direction, and wherein the word lines underlie the memory stacks and are electrically coupled with memory cells of the array in the corresponding rows; and wherein a bottom surface of each word line is completely separated from the conductive vias and the conductive wires. In an embodiment, the plurality of conductive vias comprise a plurality of upper conductive vias that extend from above the bit lines to directly contact top surfaces of corresponding word lines. In an embodiment, the dielectric structure includes an etch stop layer disposed between the word lines and conductive vias and wires disposed beneath the word lines, and wherein a top surface of the etch stop layer directly contacts an entirety of the bottom surface of each word line. In an embodiment, the top surface of the etch stop layer is substantially flat. In an embodiment, the interconnect structure is devoid of a conductive via directly contacting a bottom surface of the word lines. In an embodiment, the integrated chip further includes: a second array comprising multiple second memory stacks in a plurality of rows and a plurality of columns, wherein the second memory stacks respectively comprise second memory cells overlying second selectors, wherein the bit lines extend along corresponding columns of the second array and electrically couple with second memory cells of the second array in the corresponding columns; and upper word lines extending along corresponding rows of the second array and electrically coupled with second memory cells of the second array in the corresponding rows, wherein the upper word lines extend in the second direction, and wherein the bit lines are disposed between the upper word lines and the word lines. In an embodiment, the conductive vias and wires comprise aluminum and/or copper, and wherein the bit lines and the word lines comprise tungsten.

In some embodiments, the present application provides a method for forming a memory device, the method including: forming a lower interconnect structure over a substrate, wherein the lower interconnect structure includes conductive vias and conductive wires disposed within a dielectric structure; forming an etch stop layer along an upper surface of the lower interconnect structure; forming a plurality of word lines over the etch stop layer such that the conductive vias and wires are offset from a bottom surface of the word lines, wherein the word lines extend along a first direction and are parallel to one another; forming a plurality of memory stacks along top surfaces respectively of the word lines; forming a plurality of bit lines over the memory stacks such that the bit lines extend along a second direction orthogonal to the first direction, wherein the bit lines are parallel to one another; forming an upper ILD layer over the bit lines; and forming a plurality of upper conductive vias within the upper ILD layer such that the upper conductive vias contact top surfaces of corresponding word lines, wherein top surfaces respectively of the upper conductive vias are disposed above the bit lines. In an embodiment, the method further include: forming a plurality of semiconductor devices on the substrate, wherein the conductive vias and wires within the lower interconnect structure are electrically coupled to the semiconductor devices; wherein the word lines are electrically isolated from the semiconductor devices before forming the memory stacks and the bit lines, and wherein the word lines are electrically coupled to the semiconductor devices after forming the upper conductive vias. In an embodiment, forming the etch stop layer includes: depositing a dielectric material along a top surface of the lower interconnect structure; and performing a planarization process into the dielectric material, thereby defining the etch stop layer with a substantially flat top surface. In an embodiment, forming the plurality of word lines includes: depositing a word line layer along a top surface of the etch stop layer; and performing a dry etch process on the word line layer to define the plurality of word lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
    forming a dielectric structure over a substrate;
    forming a first conductive wire along the dielectric structure, wherein the first conductive wire extends laterally along a first direction;
    forming a memory stack on a top surface of the first conductive wire;
    forming a second conductive wire over the memory stack, wherein the second conductive wire extends laterally along a second direction orthogonal to the first direction; and
    forming an upper conductive via on the top surface of the first conductive wire, wherein an upper surface of the upper conductive via is above the second conductive wire.

2. The method of claim 1, wherein a bottom surface of the upper conductive via directly contacts the top surface of the first conductive wire.

3. The method of claim 1, wherein the dielectric structure directly contacts an entirety of a bottom surface of the first conductive wire.

4. The method of claim 1, wherein the memory stack comprises a memory cell overlying a threshold selector.

5. The method of claim 1, wherein forming the first conductive wire comprises:
    depositing a first conductive layer on the dielectric structure;
    depositing a threshold selector layer on the first conductive layer; and
    performing a first etch process on the first conductive layer and the threshold selector layer.

6. The method of claim 5, wherein forming the second conductive wire comprises:
    forming a memory cell layer over the threshold selector layer;
    forming a second conductive layer over the memory cell layer; and
    performing a second etch process on the second conductive layer, the memory cell layer, and the threshold selector layer, wherein the second etch process defines a memory cell, a threshold selector, and the second conductive wire.

7. The method of claim 6, wherein the first and second etch process respectively comprise a dry etch process.

8. The method of claim 5, wherein the first etch process comprises a reactive-ion etch that injects charge carriers into the first conductive wire.

9. The method of claim 8, wherein a charge carrier removal process is performed on the first conductive wire before forming the upper conductive via, wherein the charge carrier removal process removes at least a portion of the charge carriers from the first conductive wire.

10. The method of claim 9, wherein the charge carrier removal process comprises exposing the first conductive wire to ultra-violet (UV) light.

11. A method for forming an integrated chip, the method comprising:
    forming a dielectric structure over a substrate;
    depositing a conductive layer over the dielectric structure;
    performing a first etch process on the conductive layer to define a plurality of lower conductive wires, wherein the first etch process injects charge carriers into the plurality of lower conducive wires;
    forming a plurality of memory stacks along the lower conductive wires;
    performing a charge removal process to remove at least a portion of the charge carriers from the lower conductive wires; and
    forming a plurality of upper conductive vias over the plurality of lower conductive wires, wherein the plurality of upper conductive vias extend from above the plurality of memory stacks.

12. The method of claim 11, wherein the charge removal process comprises electrically coupling the plurality of lower conductive wires to ground.

13. The method of claim 11, wherein the charge removal process is performed before forming the plurality of upper conductive vias.

14. The method of claim 11, further comprising:
    forming a plurality of upper conductive wires above the plurality of memory stacks, wherein the upper conductive wires are formed before performing the charge removal process.

15. The method of claim 14, wherein top surfaces of the upper conductive vias are disposed above the plurality of upper conductive wires.

16. The method of claim 11, further comprising:
forming a plurality of conductive wires and a plurality of conductive vias within the dielectric structure before depositing the conductive layer, wherein an entirety of the plurality of conductive wires and the plurality of conductive vias are separated from bottom surfaces of lower conductive wires.

17. A method for forming a memory device, the method comprising:
forming a lower interconnect structure over a substrate, wherein the lower interconnect structure includes conductive vias and conductive wires disposed within a dielectric structure;
forming an etch stop layer along an upper surface of the lower interconnect structure;
forming a plurality of word lines over the etch stop layer such that the conductive vias and wires are offset from bottom surfaces of the word lines, wherein the word lines are parallel to one another;
forming a plurality of memory stacks along top surfaces respectively of the word lines;
forming a plurality of bit lines over the memory stacks such that the bit lines are parallel to one another;
forming an upper ILD layer over the bit lines; and
forming a plurality of upper conductive vias within the upper ILD layer such that the upper conductive vias contact top surfaces of corresponding word lines.

18. The method according to claim 17, further comprising:
forming a plurality of semiconductor devices on the substrate, wherein the conductive vias and wires within the lower interconnect structure are electrically coupled to the semiconductor devices; and
wherein the word lines are electrically isolated from the semiconductor devices before forming the memory stacks and the bit lines, and wherein the word lines are electrically coupled to the semiconductor devices after forming the upper conductive vias.

19. The method according to claim 17, wherein forming the etch stop layer comprises:
depositing a dielectric material along a top surface of the lower interconnect structure; and
performing a planarization process into the dielectric material, thereby defining the etch stop layer with a substantially flat top surface.

20. The method according to claim 17, wherein forming the plurality of word lines comprises:
depositing a word line layer along a top surface of the etch stop layer; and
performing a dry etch process on the word line layer to define the plurality of word lines.

* * * * *